US009484795B2

(12) United States Patent
Moss et al.

(10) Patent No.: US 9,484,795 B2
(45) Date of Patent: Nov. 1, 2016

(54) VIBRATION ENERGY HARVESTING USING CYCLOIDAL MOTION

(71) Applicant: THE COMMONWEALTH OF AUSTRALIA, Edinburgh (AU)

(72) Inventors: Scott D. Moss, Coburg (AU); Genevieve A. Hart, Ashburton (AU)

(73) Assignee: THE COMMONWEALTH OF AUSTRALIA, Fishermans Bend (AU)

( * ) Notice: Subject to any disclaimer, the term of this patent is extended or adjusted under 35 U.S.C. 154(b) by 343 days.

(21) Appl. No.: 14/265,005

(22) Filed: Apr. 29, 2014

(65) Prior Publication Data
US 2015/0123497 A1 May 7, 2015

(30) Foreign Application Priority Data
Nov. 7, 2013 (AU) .................. 2013254931

(51) Int. Cl.
F03G 7/08 (2006.01)
H02K 35/06 (2006.01)
H02K 35/02 (2006.01)
H02N 2/18 (2006.01)
H01L 41/113 (2006.01)
H01L 41/12 (2006.01)

(52) U.S. Cl.
CPC ............ H02K 35/06 (2013.01); H01L 41/113 (2013.01); H01L 41/125 (2013.01); H02K 35/02 (2013.01); H02N 2/186 (2013.01)

(58) Field of Classification Search
CPC .............. F03G 1/00; F03G 1/10; F03G 7/08; H02K 1/34; H02K 35/06
USPC .......... 290/1 R, 1 E; 310/15, 17, 23, 25, 209
See application file for complete search history.

(56) References Cited

U.S. PATENT DOCUMENTS

| 5,347,186 A | 9/1994 | Konotchick |
| 7,259,492 B2 | 8/2007 | Yang |
| 7,569,952 B1 | 8/2009 | Bono et al. |

(Continued)

FOREIGN PATENT DOCUMENTS

| RU | 2425438 C1 | 7/2011 |
| WO | 2010/151738 A2 | 12/2010 |
| WO | 2012/054994 A2 | 5/2012 |

OTHER PUBLICATIONS

Arnold, D., "Review of Microscale Magnetic Power Generation," IEEE Transactions on Magnetics 43(11):3940-3951.

(Continued)

Primary Examiner — Tulsidas C Patel
Assistant Examiner — Thomas Quigley
(74) Attorney, Agent, or Firm — Seed IP Law Group LLP

(57) ABSTRACT

Some embodiments relate to an energy conversion device, comprising: a casing; an electromagnetic (EM) transducer disposed at one side of the casing; a round magnet disposed in the casing and free to move relative to the casing and the EM transducer in at least two degrees of freedom; and a ferromagnetic object fixed relative to the casing at an opposite side of the casing to the EM transducer and arranged to attract the magnet toward a rest position within the casing. The EM transducer is positioned so that movement of the magnet relative to the EM transducer varies the magnetic field through the EM transducer, thereby generating electrical potential across at least a part of the EM transducer.

24 Claims, 18 Drawing Sheets

(56) References Cited

U.S. PATENT DOCUMENTS

| | | |
|---|---|---|
| 8,519,554 B2 | 8/2013 | Kaplan |
| 2009/0085359 A1 | 4/2009 | Mabuchi et al. |
| 2009/0167033 A1 | 7/2009 | Rapoport |
| 2010/0187835 A1 | 7/2010 | Hohlfeld et al. |
| 2011/0187207 A1 | 8/2011 | Arnold et al. |
| 2011/0285146 A1* | 11/2011 | Kozinsky ............... H02K 35/02 290/1 R |
| 2012/0280516 A1 | 11/2012 | Moss |
| 2014/0001889 A1* | 1/2014 | Hong .................... H02K 33/18 310/25 |

OTHER PUBLICATIONS

Barry et al., "Effect of Gap-Size Δ on the Output Power of a Vibro-Impacting Power Harvester," URL=http://aip.org.au/Congress2010/Abstracts/Monday%206%20Dec%20%20Poster%20Session%201/RE/Barry_Effect_of_Gap-Size.pdf, 2010, 1 page.

Dai et al., "Modeling, Characterization and Fabrication of a Vibration Energy Harvester Using Terfenol-D/PZT/Terfenol-D Composite Transducer," *Sensors and Actuators A: Physical* 156:350-358, 2009.

Dai et al., "Energy Harvesting From Mechanical Vibrations Using Multiple Magnetostrictive/Piezoelectric Composite Transducers," *Sensors and Actuators A: Physical* 166:94-101, 2011.

Erturk et al., "Broadband Piezoelectric Power Generation on High-Energy Orbits of the Bistable Duffing Oscillator with Electromechanical Coupling," *Journal of Sound and Vibration* 330:2339-2353, 2011.

Fiebig, M., "Revival of the Magnetoelectric Effect," *J. Phys. D: Appl. Phys* 38:R123-R152, 2005.

Ma et al., "Recent Progress in Multiferroic Magnetoelectric Composites: from Bulk to Thin Films," *Advanced Materials* 23:1062-1087, 2011.

Moon et al., "A Magnetoelastic Strange Attractor," *Journal of Sound and Vibration* 65(2):275-296, 1979.

Moon et al., "The Fractal Dimension of the Two-Well Potential Strange Attractor," *Physica* 17D:99-108, 1985.

Moss et al., "A Low Profile Vibro-Impacting Energy Harvester with Symmetrical Stops," *Applied Physics Letters* 97:234101-1-234101-3, 2010.

Moss et al., "Vibro-Impacting Power Harvester," *Proc. of SPIE* 7643:76431A-1-76431A-12, 2010.

Moss et al., "Broad-Band Vibro-Impacting Energy Harvester," *Materials Science Forum* 654-656:2799-2802, 2010.

Moss et al., "A Broadband Vibro-Impacting Power Harvester with Symmetrical Piezoelectric Bimorph-Stops," *Smart Materials and Structures* 20, 2011, 12 pages.

Moss et al., "A Bi-Axial Magnetoelectric Vibration Energy Harvester," *Sensors and Actuators A: Physical* 175: 165-168, 2012.

Moss et al., "Wideband Vibro-Impacting Vibration Energy Harvesting Using Magnetoelectric Transduction," *Journal of Intelligent Material Systems and Structures*, 2012, 12 pages.

Moss, "Vibration Energy Conversion Device," Office Action, mailed Feb. 21, 2014, for U.S. Appl. No. 13/464,701, 12 pages.

Office Action, dated Feb. 12, 2014, for corresponding Australian Patent Application No. 2012202647, 5 pages.

Ryu et al., "Magnetoelectric Properties in Piezoelectric and Magnetostrictive Laminate Composites," *Jpn. J. Appl. Phys.* 40:4948-4951, 2001.

Yang et al., "Design, Analysis of Broadband Vibration Energy Harvester Using Magnetoelectric Transducer," URL = http://cap.ee.ic.ac.uk/~pdm97/powermems/2010/oral-pdfs/053_Yang_88.pdf, 2010, 4 pages.

Amirtharajah et al., "Self-Powered Signal Processing Using Vibration-Based Power Generation," *IEEE Journal of Solid-State Circuits* 33(5), May 1998, 9 pages.

Ayala-Garcia et al., "A tunable kinetic energy harvester with dynamic over range protection," *Smart Mater. Struct.* 19, 115005, 2010, 11 pages.

Beeby et al., "A micro electromagnetic generator for vibration energy harvesting," *J. Micromech. Microeng.* 17:1257-1265, 2007.

Beeby et al., "Experimental comparison of macro and micro scale electromagnetic vibration powered generators," *Microsyst Technol* 13:1647-1653, 2007.

Bowers et al., "Spherical, rolling magnet generators for passive energy harvesting from human motion," *J. Micromech. Microeng.* 19, 094008, 2009, 7 pages.

Cao et al., "Electromagnetic Energy Harvesting Circuit With Feedforward and Feedback DC-DC PWM Boost Converter for Vibration Power Generator System," *IEEE Transactions on Power Electronics* 22(2), Mar. 2007, 7 pages.

Cepnik et al., "Effective optimization of electromagnetic energy harvesters through direct computation of the electromagnetic coupling," *Sensors and Actuators A* 167:416-421, 2011.

Challa et al., "A vibration energy harvesting device with bidirectional resonance frequency tunablity," *Smart Mater. Struct.* 17, 015035, 2008, 11 pages.

Ching et al., "A laser-micromachined multi-modal resonating power transducer for wireless sensing systems," *Sensors and Actuators A* 97-98:685-690, 2002.

El-hami et al., "Design and Fabrication of a New Vibration-Based Electromechanical Power Generator," *Sensors and Actuators A: Physical* 92(1-3), 2001, 21 pages.

Galchev et al., "A Parametric Frequency Increased Power Generator for Scavenging Low Frequency Ambient Vibrations," *Procedia Chemistry* 1:1439-1442, 2009.

Glynne-Jones et al., "An electromagnetic, vibration-powered generator for intelligent sensor systems," *Sensors and Actuators A* 110:344-349, 2004.

Hoffman et al., "Flexible Polyimide Film Technology for Vibration Energy Harvesting," PowerMEMS 2009, Washington, D.C., USA, Dec. 1-4, 2009, 4 pages.

Huang et al., "A Silicon MEMS Micro Power Generator for Wearable Micro Devices," *Journal of the Chinese Institute of Engineers* 30(1):133-140, 2007.

Jang et al., "A tunable rotational energy harvester for low frequency vibration," *Applied Physics Letters* 99, 134102, 2011, 3 pages.

Kaźmierski and Beeby (eds.), *Energy Harvesting Systems—Principles, Modeling and Applications*, Springer, New York, 2011, 169 pages.

Khaligh et al., "Kinetic Energy Harvesting Using Piezoelectric and Electromagnetic Technologies—State of the Art," *IEEE Transaction on Industrial Electronics* 57(3), Mar. 2010, 11 pages.

Koukharenko et al., "Microelectromechanical systems vibration powered electromagnetic generator for wireless sensor applications," *Microsyst Technol* 12:1071-1077, 2006.

Kulah et al., "An Electromagnetic Micro Power Generator for Low-Frequency Environmental Vibrations," *Proceedings of the 17th IEEE International Conference on Micro Electro Mechanical Systems*, 2004, pp. 237-240.

Kulkarni et al., "Design, fabrication and test of integrated microscale vibration-based electromagnetic generator," *Sensors and Actuators A* 145-146:336-342, 2008.

Kulkarni et al., "Fabrication and Test of Integrated Micro-Scale Vibration Based Electromagnetic Generator," Transducers & Eurosensors '07, The 14th International Conference on Solid-State Sensors, Actuators and Microsystems, Lyon, France, Jun. 10-14, 2007, 4 pages.

Mann et al., "Investigations of a nonlinear energy harvester with a bistable potential well," *Journal of Sound and Vibration* 329:1215-1226, 2010.

Moss, "Vibration Energy Conversion Device," Amendment filed May 20, 2014, for U.S. Appl. No. 13/464,701, 14 pages.

Nakano et al., "A Portable Generator Using Vibration Due to Human Walking," Proceedings Power MEMS, 2002, pp. 114-117.

O'Donnell et al., "Scaling Effects for Electromagnetic Vibrational Power Generators," DTIP of MEMS & MOEMS, Stresa, Italy, Apr. 26-28, 2006, 7 pages.

(56) References Cited

OTHER PUBLICATIONS

Pan et al., "Fabrication and analysis of a magnetic self-power microgenerator," *Journal of Magnetism and Magnetic Materials* 304:e394-e396. 2006.
Park et al., "Micro-Fabricated Electromagnetic Power Generator to Scavenge Low Ambient Vibration," *IEEE Transactions on Magnetics* 46(6):1937-1942, Jun. 2010.
Sari et al., "An electromagnetic micro power generator for wideband environmental vibrations," *Sensors and Actuators A* 145-146:405-413, 2008.
Sasaki et al., "Vibration-based automatic power-generation system," *Microsyst Technol* 11:965-969, 2005.
Serre et al., "Design and implementation of mechanical resonators for optimized inertial electromagnetic microgenerators," *Proc. of SPIE*, vol. 6589, 658905-1, 2007, 8 pages.
Serre et al., "Vibrational energy scavenging with Si technology electromagnetic inertial microgenerators," *Microsyst Technol* 13:1655-1661, 2007.
Shearwood et al., "Development of an electromagnetic microgenerator," *Electronics Letters* 33(22):1883-1884, Oct. 23, 1997.
Soliman et al., "A wideband vibration-based energy harvester," *J. Micromech. Microeng.* 18, 115021, 2008, 12 pages.
Spreemann et al., "Novel non-resonant vibration transducer for energy harvesting," PowerMEMS 2005, Takeda Hall, The University of Tokyo, Tokyo, Japan, Nov. 28-30, 2005, 3 pages.
Stephen, "On energy harvesting from ambient vibration," *Journal of Sound and Vibration* 293:409-425, 2006.
Torah et al., "Self-powered autonomous wireless sensor node using vibration energy harvesting," *Meas. Sci. Technol.* 19, 125202, 2008, 8 pages.
Vandewater et al., "Non-linear dynamics of a vibration energy harvester by means of the homotopy analysis method," *Journal of Intelligent Material Systems and Structures*, 2013, 10 pages.
Vandewater et al., "Optimal coil transducer geometry for an electromagnetic nonlinear vibration energy harvester," *Key Engineering Materials* 558:477-488, 2013.
Wang et al., "A micro electromagnetic low level vibration energy harvester based on MEMS technology," *Microsyst Technol* 15:941-951, 2009.
Williams et al., "Development of an electromagnetic micro-generator," *IEEE Proc.—Circuits Devices Syst.* 148(6):337-342, Dec. 2001.
Xing et al., "High power density vibration energy harvester with high permeability magnetic material," *Jounal of Applied Physics* 109, 07E514, 2011, 3 pages.
Xing et al., "Wideband vibration energy harvester with high permeability magnetic material," *Applied Physics Letters* 95, 134103, 2009, 3 pages.
Yuen et al., "An AA-Sized Vibration-Based Microgenerator for Wireless Sensors," *IEEE Pervasive Computing* 6(1):64-72, 2007.
Zhu et al., "Design and experimental characterization of a tunable vibration-based electromagnetic micro-generator," *Sensors and Actuators A* 158:284-293, 2010.
Zorlu et al., "A Vibration-Based Electromagnetic Energy Harvester Using Mechanical Frequency Up-Conversion Method," *IEEE Sensors Journal* 11(2), Feb. 2011, 8 pages.

\* cited by examiner

Frequency Sweeps from 5 to 12 Hz then 12 to 5 Hz, at accelerations of 500, 400, 300, 200 and 100 mg RMS

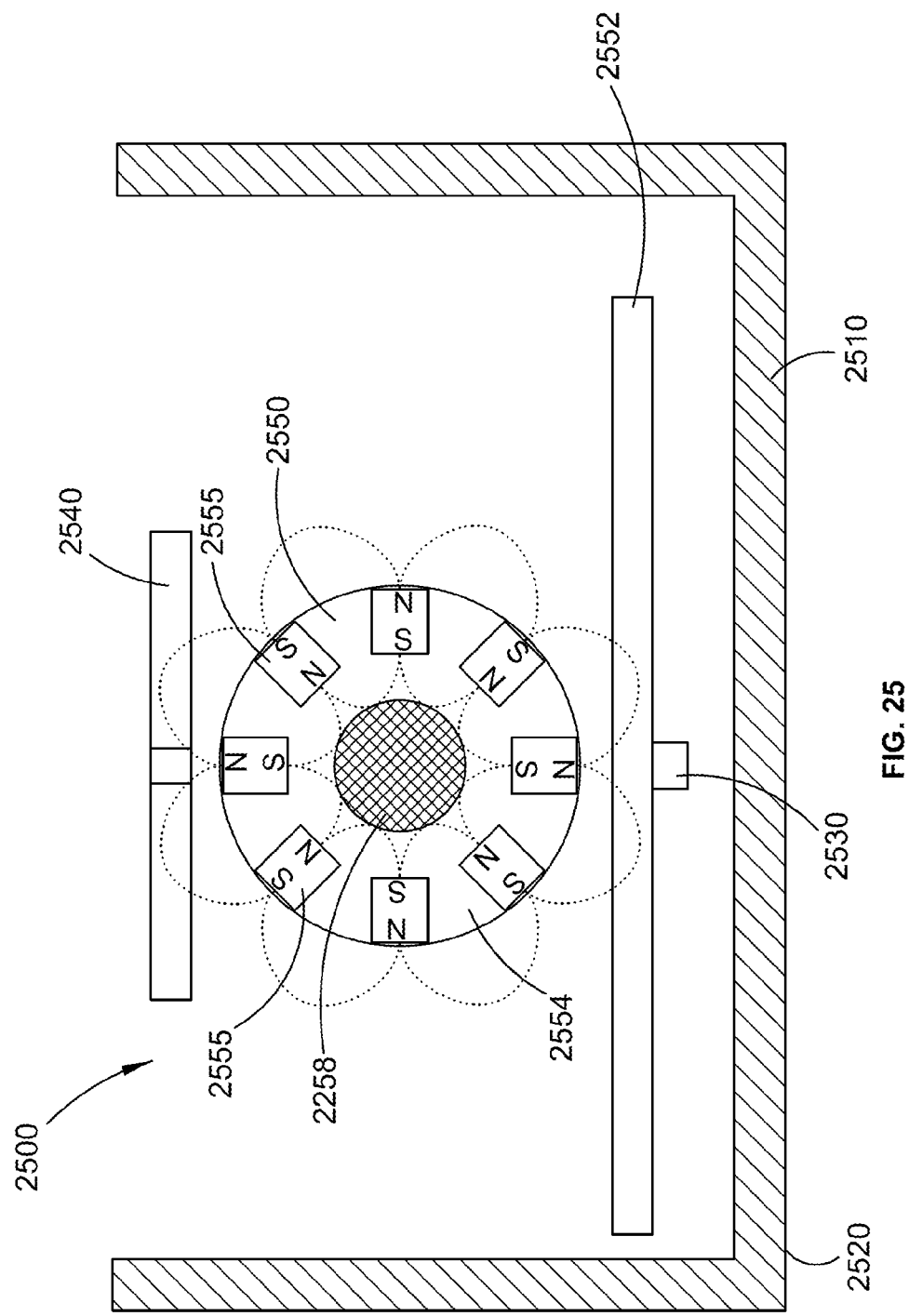

ative designs and SDOF electromagnetic designs.

VIBRATION ENERGY HARVESTING USING CYCLOIDAL MOTION

TECHNICAL FIELD

Described embodiments relate generally to vibration energy conversion devices and systems deriving electrical energy from such devices.

BACKGROUND

Over the past decade, the ever-decreasing power requirements of electronic devices has lead to considerable scientific interest in energy harvesting technologies. In particular, there has been significant interest in the area of vibration energy harvesting (VEH), particularly for single-degree-of-freedom (SDOF) piezoelectric and magnetic harvesters. Although there are a number of commercially available SDOF harvesters, there exist a number of continuing challenges that prevent widespread application of VEH, such as limited operational bandwidth and low power density. In many practical applications, the direction of the incident vibration may vary, so another challenge is the uni-axial nature of many harvesters, particularly cantilever-based piezoelectric designs and SDOF electromagnetic designs.

In addition, existing SDOF vibration energy harvesters generally are relatively heavy and/or too large for some applications, particularly those in aerospace fields. Existing SDOF harvesting devices can generally only take advantage of vibration of the host structure along a single axis. For host structures such as aircraft, it may frequently be the case that the vibration energy associated with vibration of the host structure occurs across multiple axes.

It is desired to address or ameliorate one or more shortcomings or disadvantages associated with existing vibration energy conversion devices, or to at least provide a useful alternative thereto.

SUMMARY

Some embodiments relate to an energy conversion device, comprising:
a casing;
an electromagnetic (EM) transducer disposed at one side of the casing;
a round magnet disposed in the casing and free to move relative to the casing and the EM transducer in at least two degrees of freedom; and
a ferromagnetic object fixed relative to the casing at an opposite side of the casing to the EM transducer and arranged to attract the magnet toward a rest position within the casing;
wherein the EM transducer is positioned so that movement of the magnet relative to the EM transducer varies the magnetic field through the EM transducer, thereby generating electrical potential across at least a part of the EM transducer.

The EM transducer may comprise at least one EM coil. The at least one EM coil may comprise a plurality of EM coils. The magnet may be free to move in a plane. The EM transducer and the ferromagnetic object may be co-axially aligned and may be positioned on opposite sides of the magnet when the magnet is in the rest position.

The at least two degrees of freedom may include at least one of: rotational freedom; and translational freedom. The magnet may have the form of a ball bearing. The EM transducer may be disposed at a fixed position on or in the casing. The casing may comprise a closed container.

In the absence of vibration experienced by the casing, the ferromagnetic object may tend to retain the magnet in the rest position. In the presence of vibration experienced by the casing, the magnet may tend to move about the rest position in an oscillatory or elliptical manner.

The device may further comprise a movement limiting structure disposed around the magnet to limit movement of the magnet away from the rest position by more than a predetermined distance.

The ferromagnetic object may be one of a plurality of ferromagnetic objects disposed in the casing and arranged to attract the magnet toward the rest position. The EM transducer may be disposed adjacent but spaced from the magnet when the magnet is in the rest position.

When the magnet is at the rest position, the magnet and the EM transducer may be separated by an air gap, and the gap may be between about 0.5 mm and about 3.0 mm.

The device may comprise at least two EM transducers positioned to be affected by the magnetic field of the magnet. Two of the at least two EM transducers may be disposed on opposite sides of the magnet when the magnet is in the rest position.

The device may further comprise a flat pad adjacent the ferromagnetic object across which the magnet is free to move. The pad may comprise a rubber material, wherein the rubber material comprises one of a natural rubber and a butadiene rubber.

The EM transducer may have a thin protective shield to protect the EM transducer from contact with the magnet. The EM transducer may comprise a plurality of segmented transducer sub-elements, each transducer sub-element configured to generate electrical potential independently of other transducer sub-elements in response to variation of the magnetic field.

The magnet may comprise a rare earth magnet having a remanent magnetic field of at least 1.0 T.

In some embodiments, the round magnet may include multiple magnetic elements. The magnetic elements may be arranged in a Halbach array.

Some embodiments relate to an energy conversion device, comprising:
a casing;
an electromagnetic (EM) transducer disposed at one side of the casing;
a round magnetic object disposed in the casing and free to move relative to the casing and the EM transducer in at least two degrees of freedom; and
a ferromagnetic object fixed relative to the casing at an opposite side of the casing to the EM transducer and arranged to attract the magnet toward a rest position within the casing;
wherein the EM transducer is positioned so that movement of the magnet relative to the EM transducer varies the magnetic field through the EM transducer, thereby generating electrical potential across at least a part of the EM transducer.

The round magnetic object may include multiple magnetic elements. The magnetic elements may be arranged in a Halbach array.

Some embodiments relate to a self-powering sensor system, comprising:
a sensor;
a power supply local to the sensor and coupled to supply power to the sensor; and the device as described above, arranged to provide electrical energy to the power supply.

Some embodiments relate to a structure, such as an aircraft or other vehicular structure, subject to vibration and having fixedly positioned thereon or therein the device as described above.

BRIEF DESCRIPTION OF THE DRAWINGS

Embodiments are described in further detail below, by way of example, with reference to the accompanying drawings, in which:

FIG. 25 is a schematic representation of a vibration energy conversion device according to further embodiments.

DETAILED DESCRIPTION

Figure 1A:
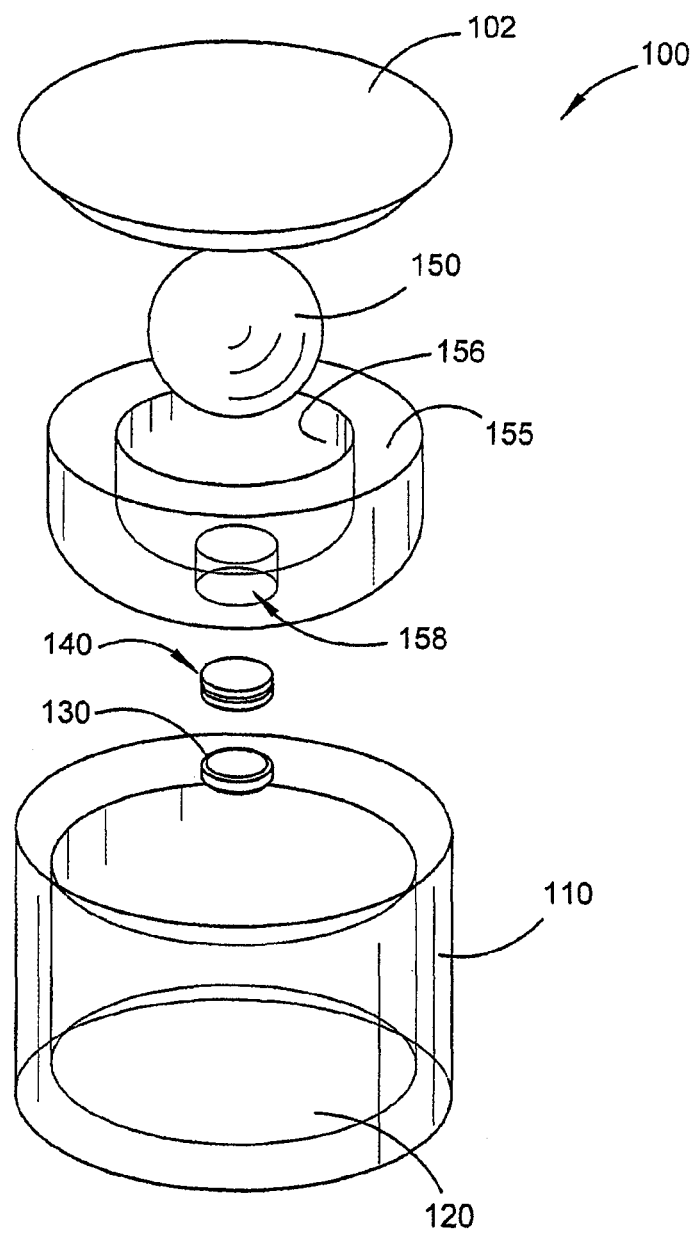
FIG. 1A is a schematic illustration in exploded perspective view of a vibration energy conversion device according to some embodiments.

Described embodiments relate generally to vibration energy conversion devices and systems deriving electrical energy from such devices.

Embodiments relate generally to devices configured to convert kinetic energy associated with a host structure (experienced as vibrations by the device) into electrical energy. Using the combination of a movable object, a transducer element, such as a magnetostrictive/piezoelectric (MP) element or an electromagnetic coil element, and a fixedly positioned magnet or a non-poled ferromagnetic object to which the movable object is attracted, movement of the object relative to the magnet or non-poled ferromagnetic object varies the magnetic field through the transducer element to generate electrical energy. If the transducer element is an electromagnetic coil, the variation of the magnetic field through it induces current flow through the electromagnetic coil. If the transducer is an MP element, the variation of the magnetic field causes stresses which induce the piezoelectric part of the MP element to generate a potential difference (i.e. voltage) across at least a part of itself. This electrical energy may be used to charge a capacitor, which may in turn be used to trickle-charge a rechargeable power supply, such as a rechargeable battery. This rechargeable power supply may then be used to supply power to a sensor, whereby the sensor, the power supply and the energy conversion device form a self-powering sensor system when at least the energy conversion device is subject to accelerations inducing movement of the object relative to the magnet.

In some embodiments, the movable object may be a round magnet, for example in the form of a spherical bearing formed of rare earth materials and have a remanent magnetic field of at least 1.0 Tesla. In such embodiments, the transducer element may comprise an electromagnetic transducer.

Employing an object that is untethered and/or free to move with at least two degrees of translational (as opposed to rotational) freedom allows kinetic energy associated with vibrations of a multi-directional nature to be harvested. Such arrangements may thus have applicability to aerospace applications or other applications where vibrations are frequently encountered.

Additionally, the described arrangements enable construction of a compact energy conversion device having relatively low mass and volume compared to SDOF energy harvesters, which is advantageous in some applications.

Some embodiments employ an inherently compact bi-axial VEH approach that utilizes a permanent-magnet/ball-bearing combination, which operates in conjunction with a magnetostrictive piezoelectric (MP) element, such as a Terfenol-D/PZT laminate transducer, which may be described as one example of a magnetoelectric (ME) transducer. Such embodiments may thus use an oscillating bearing to create magnetic flux steerage through a magnetoelectric laminate transducer to generate harvestable electrical power. However, as noted above, some embodiments may employ an electromagnetic coil as another example of a ME transducer. For illustration purposes, this description focuses mostly on use of a MP element as the ME transducer but this is not intended to limit the applicability of any described embodiments.

Figure 1B:
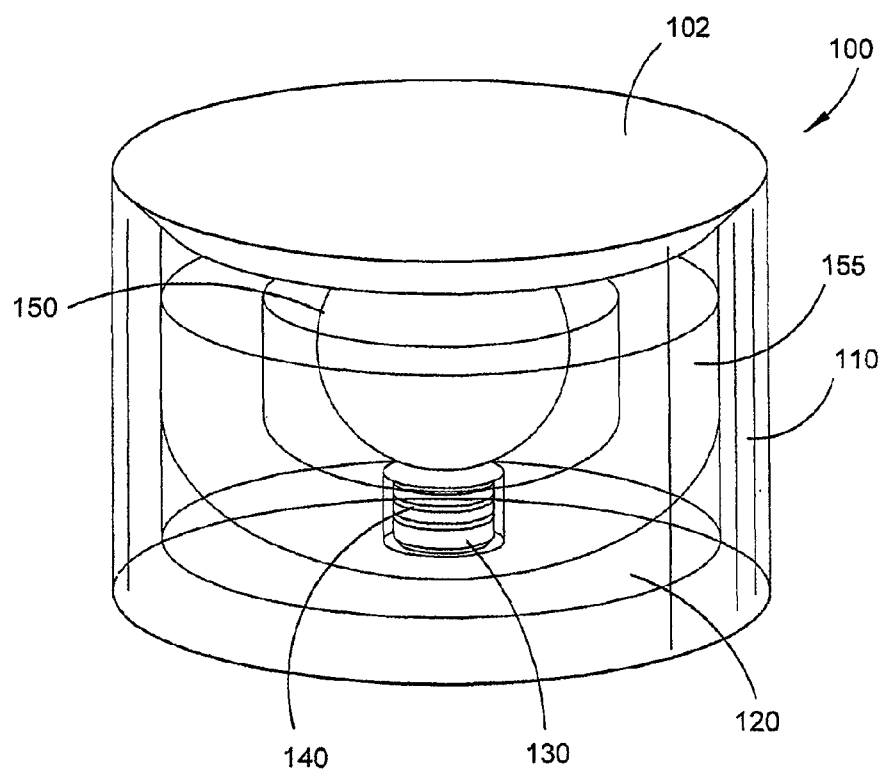
FIG. 1B is a schematic illustration of the device of FIG. 1A in perspective view.
Figure 21:
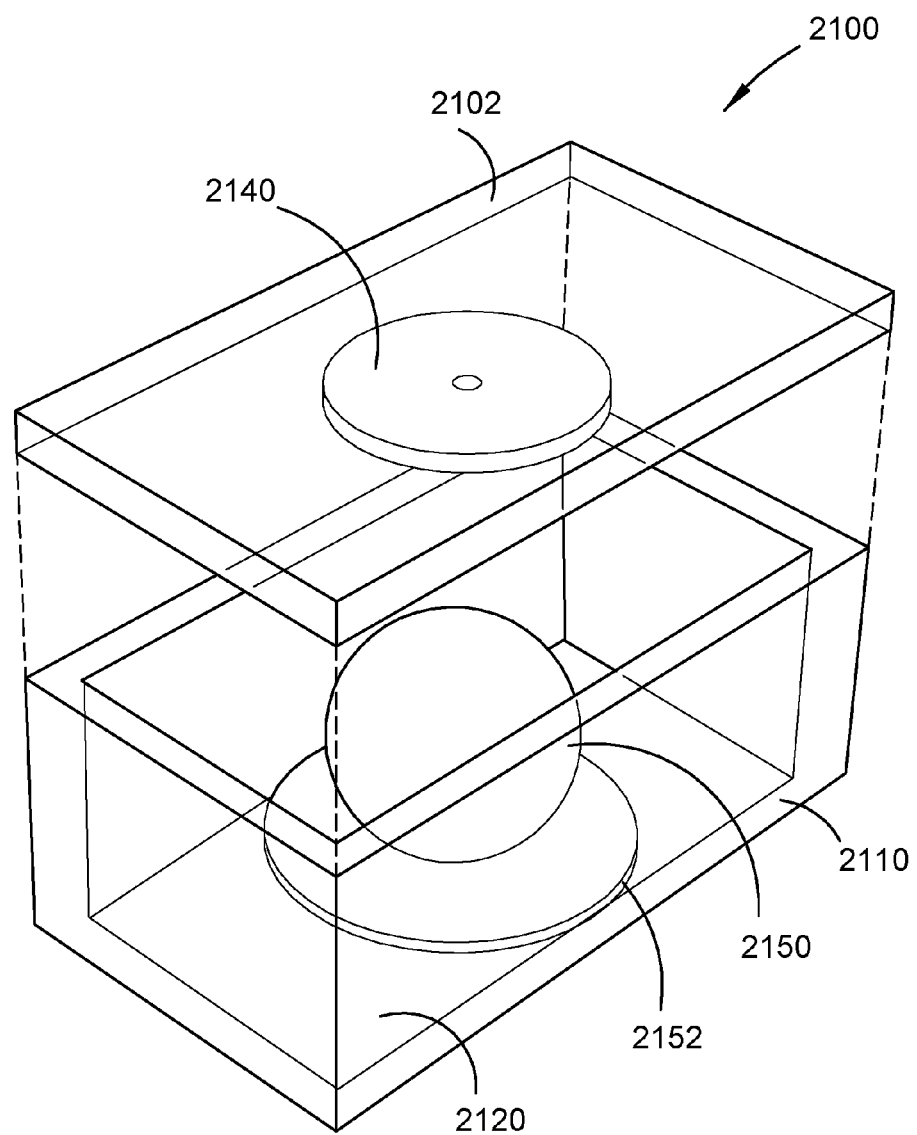
FIG. 21 is a schematic illustration in exploded perspective view of components of a vibration energy conversion device according to further embodiments.

Referring now to FIGS. 1A, 1B and 2 to 4, an energy conversion device 100 according to some embodiments is described in further detail. FIGS. 1A and 1B show device 100 in exploded and assembled configurations, respectively. Device 100 has a housing or casing 110 with a base 120 and a lid 102 cooperating to define an enclosed volume within the casing 110. Casing 110, including base 120 and lid 102, may be magnetically conductive, although it is not strictly necessary. Casing 110 may be generally cylindrical, cuboid or rectanguloid in form, for example. For illustration purposes, a cylindrical casing 110 is described herein. An alternative rectanguloid casing 2110 is shown in FIG. 21.

Figure 4:
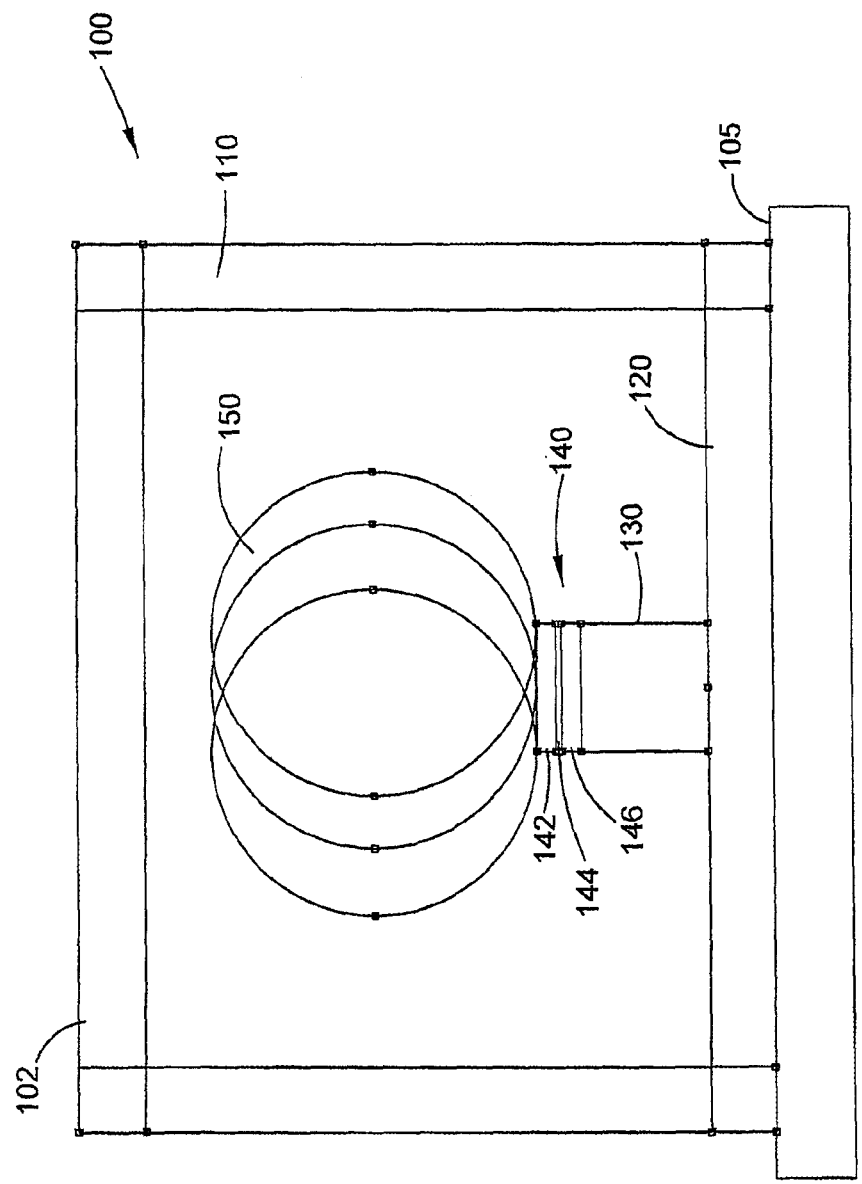
FIG. 4 is a schematic illustration of an energy conversion device according to some embodiments.

As shown in FIG. 4, casing 110 may be mounted on or otherwise coupled to a host structure 105 to have a chosen horizontal, vertical or angled orientation. Host structure 105 may be any suitable structure to which described energy conversion devices may be usefully coupled. The casing 110 is fixedly coupled, either directly or indirectly to the host structure 105 so that movement of the host structure 105 causes corresponding movement of the casing 110 and its contents (other than an untethered object 150).

As shown in FIGS. 1A and 1B, the object 150 is disposed within the enclosed volume of casing 110 in proximity to a magnet 130 and an MP element 140. The MP element 140 is positioned between the magnet 130 and the object 150, so that the magnetic field emanating from the magnet and coupled into the magnetically conductive object 150 passes through the MP element 140. This is illustrated in further detail in FIGS. 3A and 3B. The relative positioning of the magnet 130, MP element 140 and object are preferably selected to generally maximise the degree to which changes in object position are converted into electrical potential.

Device 100 may also comprise a movement limiting structure distinct from the walls of the casing 110 so that the object 150 is not allowed to move beyond where the magnet 130 can exert a magnetic restoring force on the object 150. Alternatively, walls of the casing 110 may act as a movement limiting structure, although in such embodiments, a non-magnetic insulating layer may be provided on the inside of the walls.

In the embodiments illustrated in FIGS. 1A and 1B, the movement limiting structure serves as a 360° mechanical stop and is provided by a non-magnetic cup-shaped element 155 having an interior surface 156 defining a central cavity within which the object 150 is receivable. The cup-shaped element 155 also has a passage or recess formed at the apex or bottom of the cavity to house the magnet 130 and MP element 140 in close proximity to the object 150. In some embodiments, the passage or recess 158 may provide a thin layer of material, such as a wear pad 152 (see FIGS. 15, 17 and 20), between the MP element 140 and the object 150 in order to mitigate wear on the MP element 140 by movement of the object 150.

The wear pad 152 may be formed as a thin disc of a hard material having a high Young's modulus (e.g. around 350 GPa or higher) and resistant to wear by the object 150 as the object 150 travels across the surface of the wear pad 152, for example. The Young's modulus of the wear pad 152 should be higher than the Young's modulus of the object 150, which for chrome-plated steel may be in the order of 300 GPa. The wear pad 152 is preferably substantially non-ferromagnetic. The material of the wear pad may be tungsten carbide or aluminium oxide, for example. The wear pad 152 may have a diameter of around 20-30 mm and a thickness of about 1.0 to 0.5 mm or possibly about 0.8 mm. Preferably, there is a low coefficient of sliding friction and rolling friction between the object 150 and the wear pad 152. A dry or fluid lubricant may be added at the interface between the object 150 and the wear pad 152.

In other embodiments, the object 150 may be allowed to substantially directly contact the MP element 140 or other transducer element, although some kind of coating or lubricant on the MP element 140 or other transducer element may be used to mitigate wear and/or affect the coefficient of friction between the object 150 and the MP element 140 or other transducer element.

The cup-shaped element 155 may be formed of Teflon, for example, or other materials having similar low magnetic conductivity and/or wear resistant characteristics. Materials other than Teflon that may be suitable include aluminium metal materials, rubber or rubber-like elastic materials, alumina ceramic materials and suitable polytetraflouroethylene (PTFE) materials or similar polymers. Depending on the embodiment, a wear pad 152 may be positioned at the base of the element 155 between the object 150 and the magnet 130 or MP element 140 or EM transducer as described below. The cup-shaped element 155 may have a roughly annular cross-section orthogonal to an axial centre line of the device (i.e. as indicated by reference indicator 170 in FIG. 2) with the annular cross-section of element 155 transitioning to a smaller inside diameter where it defines the passage or recess 158. If the casing 110 is magnetically conductive, then the thickness of the annular wall of element 155 may be selected to minimise magnetic attraction between object 150 and casing 110.

The Young's modulus of the movement limiting structure (where it will be impacted by the object 150) may be significantly lower than that of the object 150, for example by an order of magnitude or more. As an example, aluminium has a Young's modulus of around 60 GPa and has been found to work well in described embodiments as a material for the movement limiting structure and to provide a vibro-impact effect.

Figure 2:
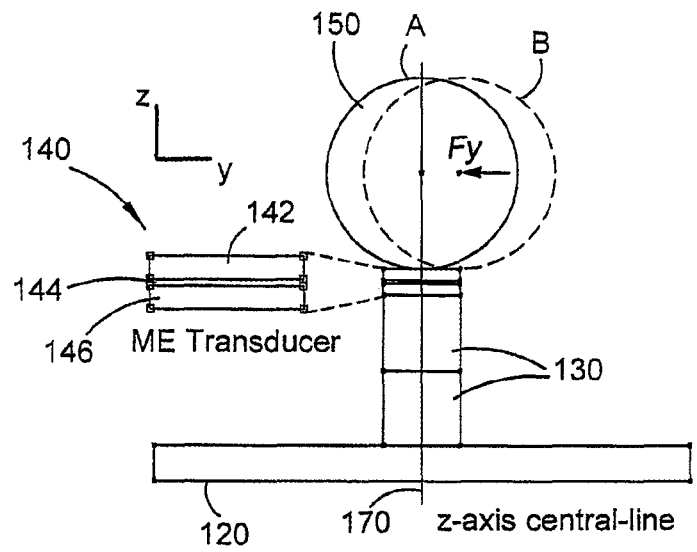
FIG. 2 is a schematic illustration of elements of a vibration energy conversion device according to some embodiments.

FIG. 2 is a schematic diagram of the permanent-magnet/ball-bearing oscillator arrangement forming part of device 100, and also shows the location of the ME transducer 140. FIG. 2 is provided primarily for illustration purposes to show that magnet 130 (or more than one magnet 130) exerts a restoring force Fy on an object 150 (in this case a substantially spherical object, such as a ball bearing, when it is in position B), tending to bias the object 150 towards a central rest position A, where the centroid of spherical object generally coincides with the axial centre line 170 of the device 100 that extends through the object 150, the MP element 140 and the one or more magnets 130.

FIG. 2 shows the MP element 140 in slightly more detail illustrating a piezoelectric layer 144 sandwiched between an upper magnetostrictive layer 142 and a lower magnetostrictive layer 146, The magnetostrictive layers 142, 146 may be formed of Terfenol-D, while the piezoelectric layer 144 may be a piezoceramic. Layers 142, 144 and 146 may be bonded in this sandwich arrangement by a suitable bonding agent, such as an epoxy, for example.

Figure 3A:
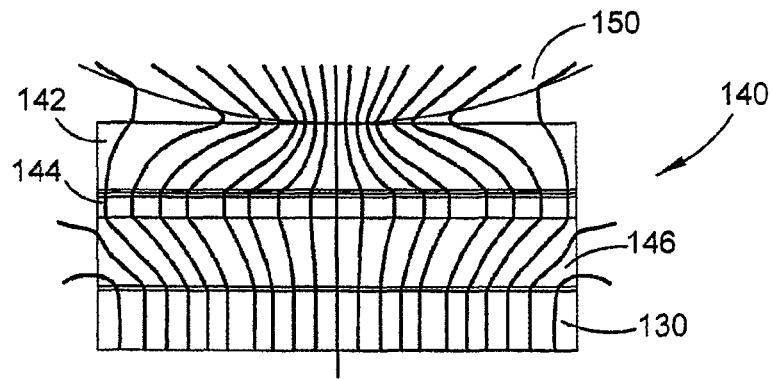
FIG. 3A is a magnified view of a magnetostrictive/piezoelectric (MP) element affected by a magnetic field of an adjacent magnet, illustrating predicted magnetic field lines for an object located centrally on the MP element.
Figure 3B:
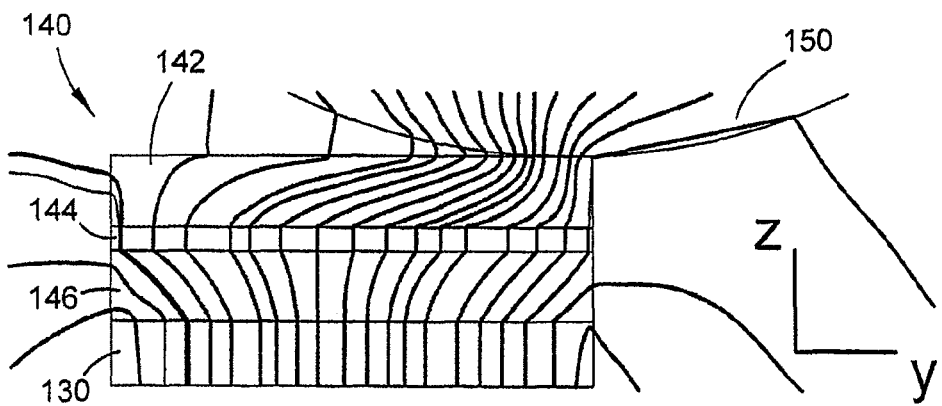
FIG. 3B is a magnified view similar to FIG. 3A, but showing the object having moved to an edge of the MP element.

FIGS. 3A and 3B illustrate predicted magnetic field lines through the object 150, MP element 140 and magnet 130 when the object 150 is in the rest position (FIG. 3A) and in an off centre position close to the edge of the upper magnetostrictive layer 142 (FIG. 3B). FIGS. 3A and 3B thus help to illustrate variation of the magnetic field through the MP element in response to movement of the object 150. Magnetic field variations in the MP element 140 in the order of about 0 to 250 mT are expected to occur with the described arrangements.

Embodiments described and depicted herein generally employ a spherical ball bearing as the movable object 150. However, another form of rounded object may be employed in alternative embodiments, including solid or partially solid objects. Such rounded objects include, for example, spheroid, part-spheroid, frusto-spheroid, ovoid and part-ovoid objects. The ball bearing described herein is formed of chromium plated steel. However, objects 150 of other magnetically responsive materials may be employed instead. If a spherical bearing is used as the object 150, it may have a diameter of about 15 mm to about 30 mm, for example. Preferably, the diameter is about 20 to 25 mm.

Figure 20:
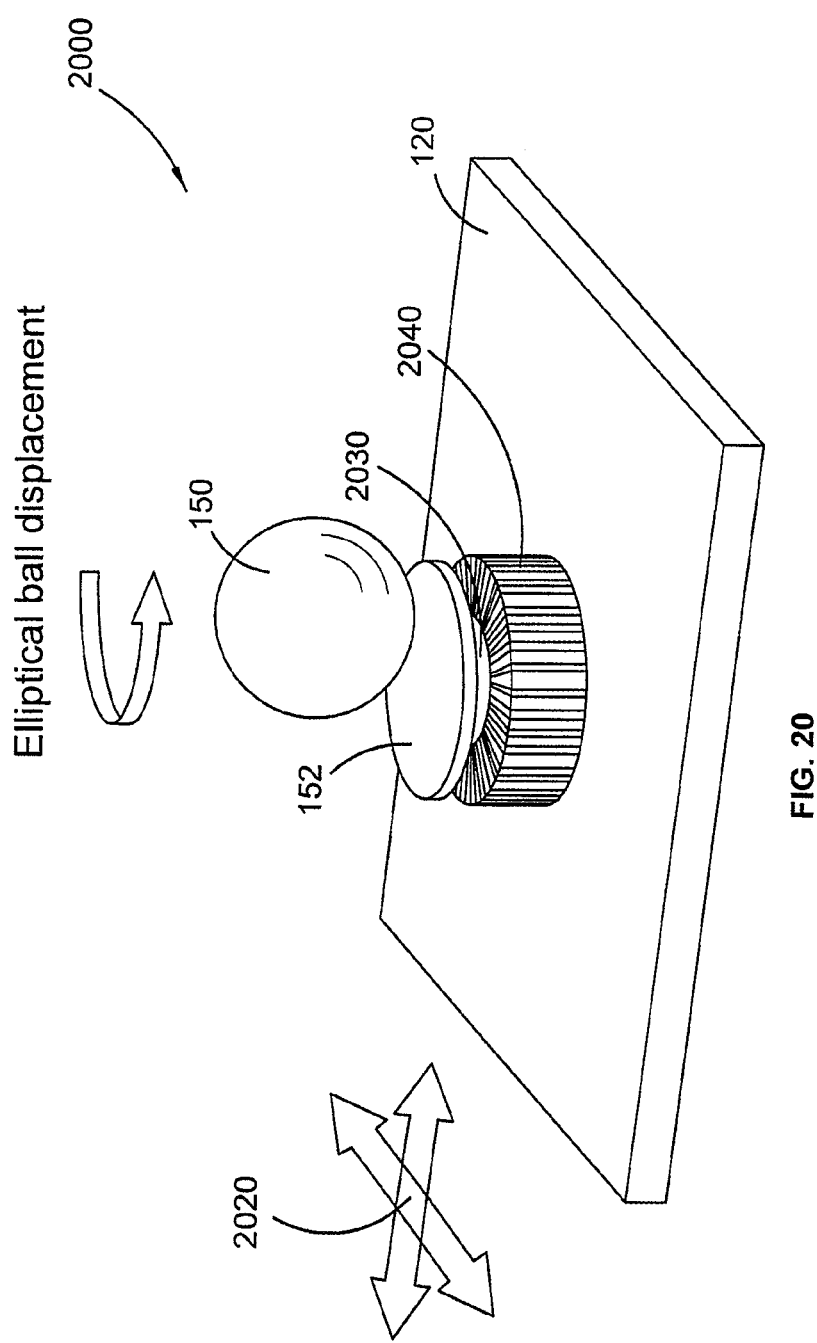
FIG. 20 is a schematic illustration of components of a vibration energy conversion device according to further embodiments.

In embodiments described herein, the object 150 is free to move in at least two dimensions. That is, the object 150 is free to move in at least the x and y directions if the central axis 170 defines the z axis of a three dimensional Cartesian coordinate system. Depending on the embodiment, the wear pad 152 or other support surface on which the object 150 may move may have some degree of curvature (like a curved bowl surface, for example), with the result that some movement in the z direction may occur simultaneously with movement in the x and y directions. Because the contemplated embodiments use a rounded object 150, this movement will involve freely rolling in at least the x and y directions and possibly also in the z direction, which equates to having at least two translational degrees of freedom. While it is contemplated that the object 150 will have the freedom to rotate (roll) about an axis generally parallel with the x-y plane and thus move translationally, it has been experimentally determined that for certain embodiments (such as are depicted in FIG. 20, for example) there may be rotation about the central axis 170 or an axis parallel thereto. In embodiments adopting the configuration shown and described in relation to FIG. 20, the object 150 may move in an elliptical or circular orbit about the z-axis.

For non-spherical objects or objects that are only part-spherical, the movement of the object 150 within the casing 110 may be less translational (i.e. rolling laterally away from or toward the central axis 170) and involve more rotational or rocking movement. Reference to translational movement of the object 150 herein is intended to refer to movement of the center of mass of the object. Depending on the shape of the object 150, the center of mass of the object 150 may not rotate significantly during the translational movement.

Described embodiments generally contemplate that the object 150 is mechanically untethered within the casing 110, with the only thing causing it to tend to return to the rest position (absent any externally applied vibrational stimulus) being the attraction of the object 150 to the magnet 130. In other words, the object 150 is not mechanically connected to anything in the casing 110. However, in alternative embodiments, it may be possible to have some mechanical connection or coupling that amounts to some form of tethering between the object 150 and a part or component in or on the casing 110, while still allowing at least two degrees of freedom of movement of the object 150 within the casing 110.

Referring also to FIG. 4, device 100 is depicted in the absence of movement limiting element 155 for illustration purposes, although element 155 may be included as illustrated in FIGS. 1A and 1B. FIG. 4 illustrates one of several possible configurations of the object 150, MP element 140 and magnet 130. In the depicted arrangement, the MP element 140 is directly interposed between the object 150 and the one or more magnets 130. However, in other embodiments, such as are described with reference to FIGS. 5 and 6, the MP element 140 may be positioned in a different arrangement, for example involving magnets on opposite sides of the object and one or more than one MP element 140 positioned around the object to be affected by variations in the magnetic field caused by movement of the object 150. Further, the MP element 140 is illustrated as one form of a generalised transducer element and can be substituted for an EM coil, such as is shown and described below in relation to FIGS. 17 and 20.

Figure 5:
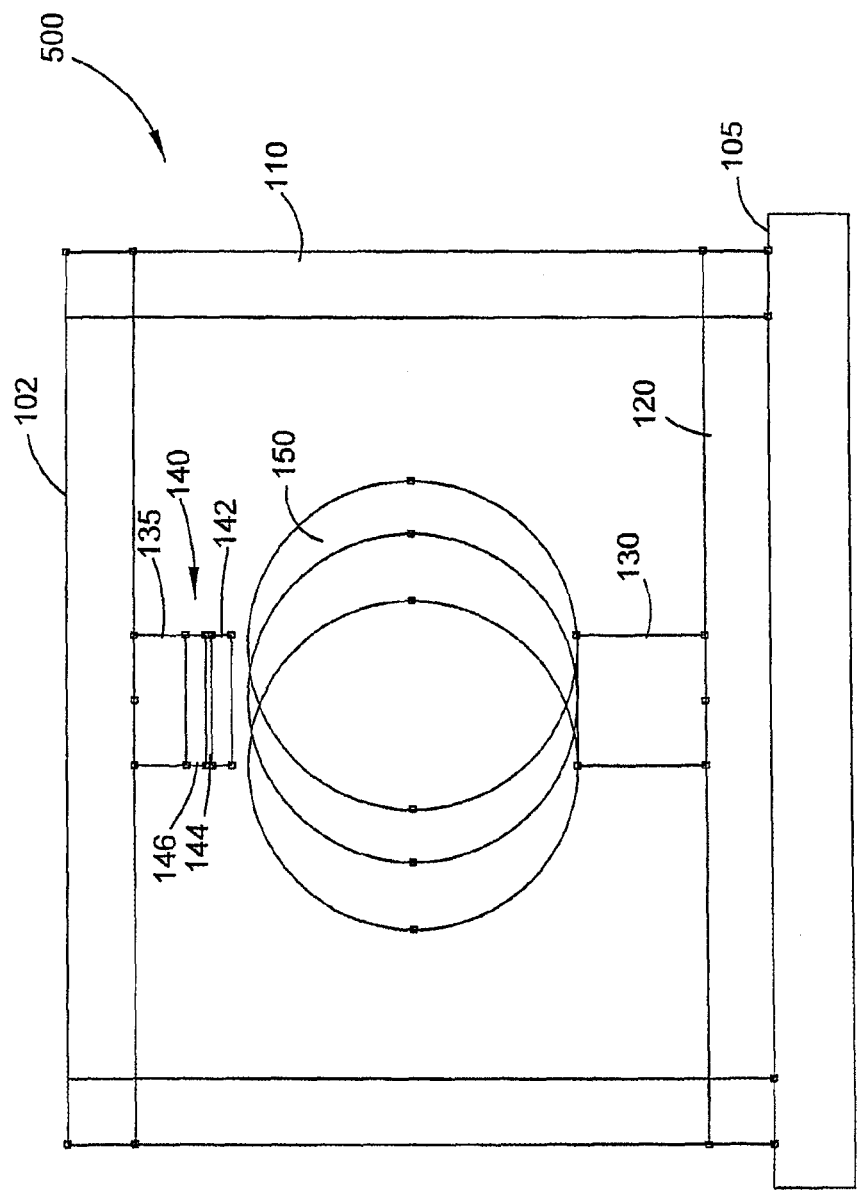
FIG. 5 is a schematic illustration of an energy conversion device according to further embodiments.

Referring to FIG. 5, an alternative arrangement of device 100 is shown, designated by reference numeral 500, by employing the same general components as described above. In arrangement 500, object 150 may be subject to a magnetic restoring force applied by the magnetic field of a magnet 130 with which it is in contact or closely adjacent thereto. Magnet 130 is coupled (i.e. mechanically or magnetically affixed or adhered) to the base 120. On an opposite side of magnet 130, MP element 140 is disposed together with a further magnet 135, both positioned along the same axial centre line 170 extending through the rest position of object 150 and magnet 130. In this arrangement, the magnetic field through object 150 and MP element 140 will be affected by both magnets 130 and 135, but movement of object 150 will still vary the magnetic field through MP element 140 in a manner generating electrical potential. Although not shown in FIG. 5, a wear pad 152 may be located between the object 150 and the magnet 130.

Figure 6:
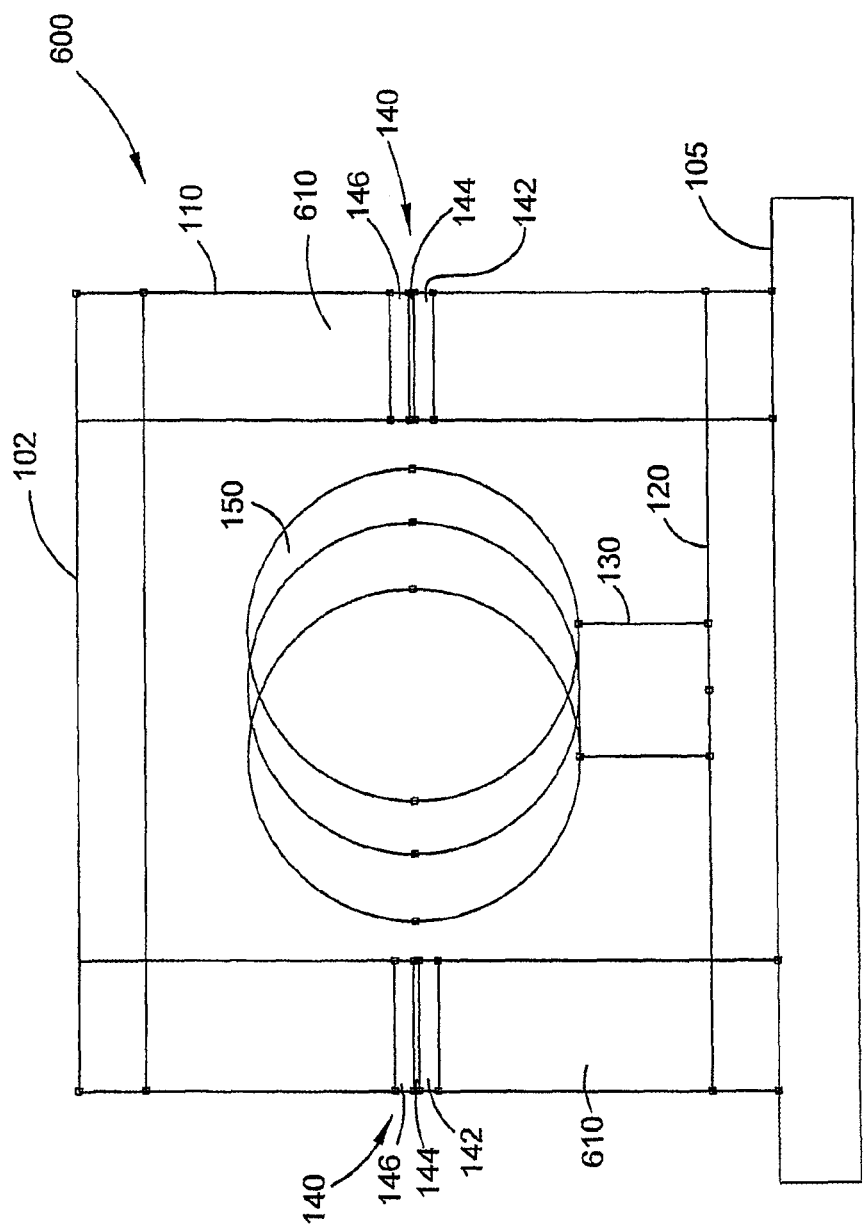
FIG. 6 is a schematic illustration of an energy conversion device according to further embodiments.

A further variation in the arrangement of elements within device 100 is shown in FIG. 6 and indicated by reference indicator 600. In arrangement 600, multiple MP elements 140 are positioned on opposite lateral sides (relative to 'vertical' centre line 170) of the object 150, with the MP elements again being poled in a direction generally orthogonal to the plane in which object 150 is free to move. In arrangement 600, MP elements 140 are positioned within closed wall sections 610 of the casing 110. In other embodiments, MP elements 140 may be positioned interiorly of the walls of casing 110 and held in place (with the same polar orientation as described) by other positioning structure. In some embodiments, the positioning structure to hold MP elements 140 in position relative to object 150 may include cup-shaped element 155 or a further positioning structure cooperating with the movement limiting structure. In the arrangement 600 shown in FIG. 6, the object 150 is magnetically coupled to magnet 130, which is in turn coupled (i.e. mechanically affixed or adhered) to the base 120 of the casing 110. In alternative arrangements, magnet 130 may be instead coupled to the lid 102. Although not shown in FIG. 6, a wear pad 152 may be located between the object 150 and the magnet 130.

Further variations of the described arrangements depicted in FIGS. 4 to 6 may be employed, including additional magnets 130, 135 and/or MP elements 140. For example, two or more of the arrangements shown in FIGS. 4, 5 and 6 may be combined. Additionally, more than one pair of MP elements shown in FIG. 6 may be employed, with MP elements positioned at 90° intervals around the casing. Further, more than two pairs of opposed MP elements 140 may be employed, such as 3, 4, 5 or 6 pairs of MP elements 140, for example, optionally arranged circumferentially.

While FIGS. 4, 5 and 6 show that casing 110 is coupled to host structure 105 via base 120, casing 110 may instead be coupled to host structure 105 along a side wall or coupled so that the orientation of the casing 110 relative to the host structure 105 is different from that shown.

Magnets 130 and 135 described herein may be rare earth magnets, for example. The magnets 130, 135 may have a remanent field of approximately 1.3 Tesla and the object 150 may be a chromium plated steel ball bearing of mass approximately 67 grams, for example. The magnetic fields generated by the one or more magnets 130, 135 serve a dual purpose: to generate a magnetic field that applies a magnetic restoring force to the object 150 which (possibly in combination with movement limiting structure) sets up oscillatory movement in response to an acceleration applied to the device 100; and the magnetic field serves to attract the object 150 under the magnet 130 such that if device 100 is exposed to an impulse acceleration, then object 150 tends to experience decaying oscillation about a rest position generally coinciding with a central axis 170. It should be noted that although generally circular cross-section magnets 130,135, 1730 (FIG. 17), 2030 (FIG. 20) are shown and described herein, some embodiments may employ magnets 130, 135, 1730, 2030 that are non-circular, such as elliptical, rectangular or other suitable simple or regular polygon shapes. Further other magnets may be used that do not have a continuous surface or that are non-planar where such magnets are positioned adjacent the object 150 or the MP element 140 or coil 1740, 2040. One example of this is the annular magnet 2030.

Device 100 and the various described embodiments may be generally axi-symmetric about central axis 170, although it is understood that perfect symmetry is generally not achievable or is impractical to achieve. If casing 110 is not cylindrical and/or MP elements 140 are disposed at different lateral positions around object 150, then at least object 150 and magnets 130 and/or 135 are preferably generally axi-symmetric.

Although Terfenol-D is described as one possible magnetostrictive layer, Galfenol or other suitable materials may be employed in the magnetostrictive layer instead. Further, magnets 130 and 135 or MP elements 140 may have one or more of their surfaces coated with a ceramic material to reduce the effect of wear due to contact with the moving object 150.

Where a movement limiting structure such as cup-shaped element 155 is employed, it should generally have a Young's modulus of similar order of magnitude to that of the object 150 in order to assist in establishing oscillation around the rest position at a resonant frequency determined by the characteristics of the one or more magnets 130, 135 and object 150.

Figure 7:
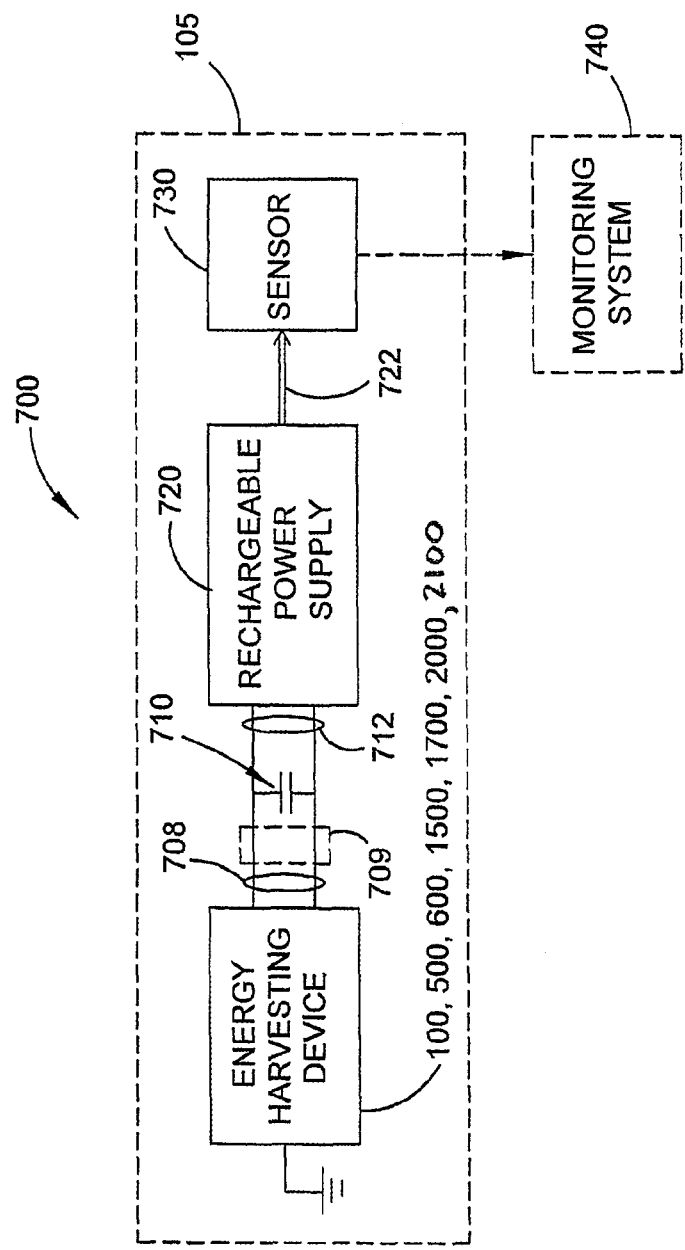
FIG. 7 is a schematic illustration of a system deriving electrical energy from described energy conversion device embodiments.

Referring also to FIG. 7, a system 700 is shown, in which an energy harvesting device (according to any of the described configurations, including arrangements 100, 500, 600, 1500, 1700, 2000 and 2100) is employed within or on a host structure 105 and electrically coupled to a rechargeable power supply 720 via a capacitor 710 of suitable size and coupling conductors 708, 712. Although not shown, conductors are coupled to the piezoelectric layer of MP element 140 or to EM transducer elements 1740, 2040 to allow transfer of electrical charge outside of the energy harvesting device. These conductors are coupled to capacitor 710 (e.g. via conductors 708) and their signals may pass through a rectification circuit or devices 709 (e.g. diodes, transistors or electrical transformers). In this way, device 100, 500, 600, 1500, 1700, 2000 or 2100 can charge capacitor 710 from its oscillating electrical output, and capacitor 710 can in turn be used to trickle charge the rechargeable power supply 720. Power supply 720 is then used to provide power via a suitable conductor 722 to a sensor 730. Sensor 730 may be any suitable sensor, such as a strain, load, humidity, temperature, pressure, distance, flow or other sensor adapted to be powered by a relatively low power supply (e.g. where the output power of the energy harvesting device 100 is in the order of 0 to 200 microwatts or possibly up to tens or hundreds of milliwatts). As an alternative to the circuit elements shown and described by way of example in FIG. 7, commercially available power conditioning and energy storage circuits can be used, such as are available from Linear Technology of Milpitas, Calif., USA.

Figure 23:
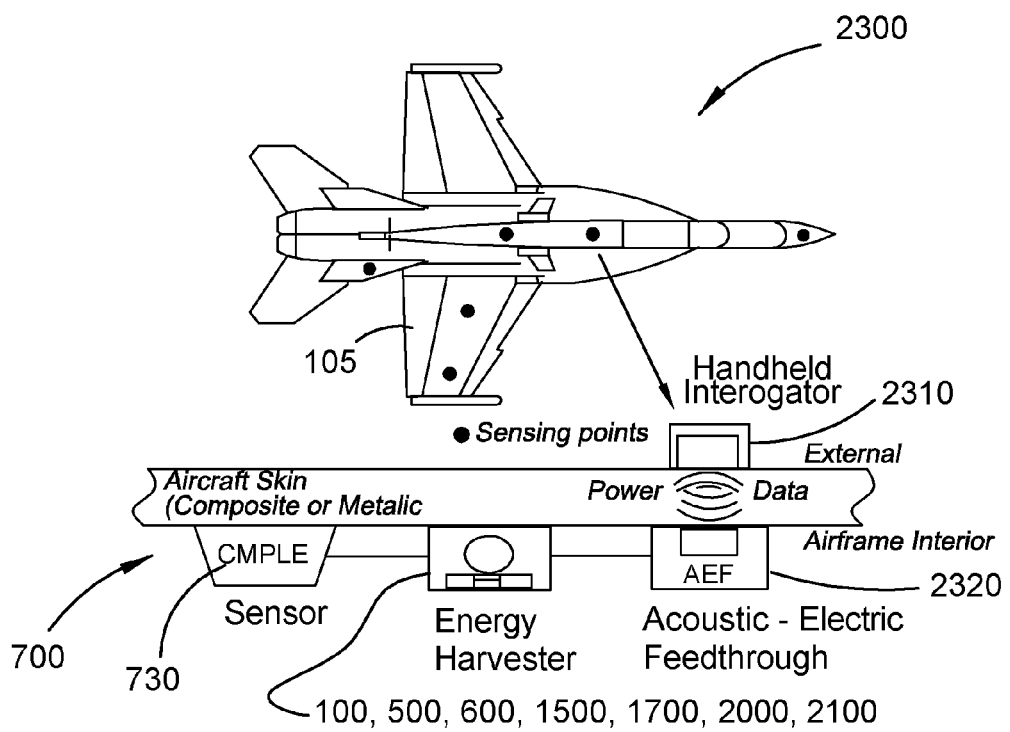
FIG. 23 is a schematic illustration of an example host structure and craft on or in which vibration energy conversion device embodiments may be carried as part of a system shown in FIG. 7.

System 700 may be contained within an external shell, hull or skin of the host structure 105 in some applications, such as in marine, automotive or aerospace applications, where the sensor 730 is an environmental sensor positioned to monitor structural health of part of the craft. FIG. 23 is an example schematic diagram of an aircraft 2300 (as one example of a craft acting as a host structure 105). In such applications, sensor 730 may communicate in a wired or wireless manner with a monitoring system 740 in another part of the craft or external to the craft. For example, an external handheld interrogator 2310 may be used to interrogate the sensor 730 via a suitable interface 2320, such as an acoustic-electric feed-through interface positioned on an inside of the skin of the craft, for example. The acoustic-electric feedthrough 2320 may receive power (in the form of acoustic energy) from the interrogator 2310 and may exchange data therewith. It should be appreciated that system 700 may be applied in various other situations outside of marine, automotive and aerospace fields and thus the examples given should not be considered as anything other than illustrative.

In some embodiments, MP element 140 may be comprised of a number of separate but aggregated MP elements, each providing a separate output in order to reduce an averaging effect that would be experienced across a single larger MP element and allow greater power to be harvested from certain MP elements that experience greater strain due to higher local magnetic field variation than in other areas. For example, MP element 140 may be made up of an array of tiled sub-elements arranged in the x-y plane (where the x direction is into the page as shown in the Figures).

Some described embodiments may advantageously utilise a bi-axial vibro-impact effect (set up by oscillation of the object about the rest position and elastic impact of the object with the movement limiting structure) to yield a relatively broad frequency response of the energy conversion device 100 to vibration of the host structure 105.

In an experiment to validate the hypothesised operation of the device 100, the steel bearing was Cr-plated and spherical with a diameter of 25.4 mm; the rare-earth magnets (NdFeB, grade N42) and the ME transducer were cylindrical, with a diameter of 10 mm.

The ME transducer was formed by bonding the Terfenol-D (Etrema Products Inc.) and PZT-5A elements (Pz27, Ferroperm Piezoceramics A/S) with silver loaded epoxy (Circuitworks CW2400) that was cured for two hours at 55 C under a compressive load of ~1 MPA. To maximize output from the ME transducer the magnetostrictive and piezoelectric layers are 1.5 mm and 0.5 mm thick respectively. The host structure oscillates in the x-y plane. The magnets, and the piezoceramic 3-direction, are poled in the z-direction. The magnets are 10 mm thick, and for experimental convenience two magnets were stacked together for a total magnet thickness of 20 mm, and attached to a 5 mm thick steel base. A thin layer of bees wax was employed at the interface between the ME transducer and the upper magnet to minimize shear movement.

The bearing is subject to a magnetic restoring force in the x-y plane (where x is normal to the page and the y-z plane is parallel to the page, as in FIG. 2) exerted by the magnetic field of the magnets, however is otherwise untethered and free to move across the surface of the upper magnetostrictive element in response to host structure oscillations. Comsol multi-physics software was used to make predictions about the restoring force Fy (rotational effects were ignored). Magnetic force predictions were made (shown in FIG. 8) assuming that the ME transducer acted as a 3.5 mm gap between the magnet and the bearing (i.e. there is a 3.5 mm separation between the bearing and the magnet in the z-direction. Stable finite element solutions were obtained if the maximum element dimension chosen was 1.5 mm or less, and also if the meshing of the magnet and bearing were of sufficient fidelity (i.e. so that the finite element mesh contains small enough elements to adequately represent the modelled shapes).

Figure 8:
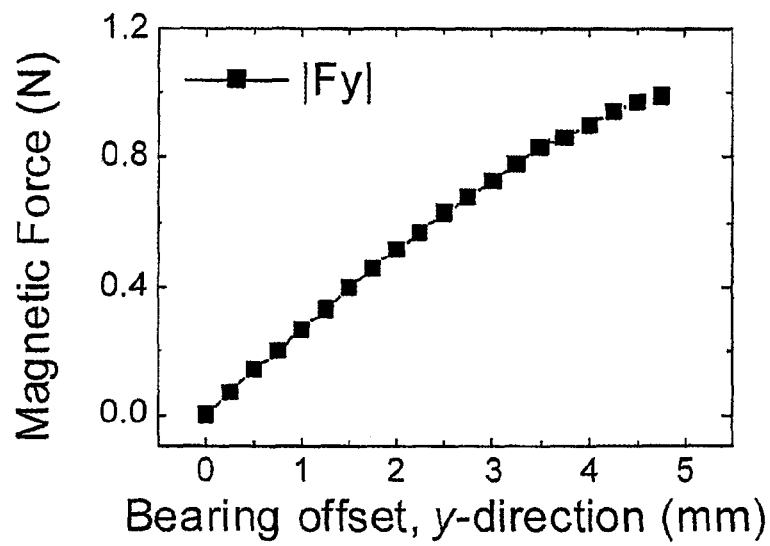
FIG. 8 is a plot of predictions of a magnetic restoring force acting on a bearing as a function of distance from a vertical centre line of the device of some embodiments.

The central-line of the harvester is defined as the vertical line (z-direction) through the centre of the magnet, as shown by reference indicator 170 in FIG. 2. FIG. 8 predicts that Fy is linear near the central-line (i.e. y≤2.0 mm) and has a spring constant of k=260 N/m. The bearing mass is approximately m=67 grams, and hence the predicted resonant frequency of the bearing/magnet arrangement is $f_{RESONANCE}=(1/2\pi)\sqrt{k/m}$~9.9 Hz. As the bearing moves from the central-line (towards the edge of the magnet) then FIG. 8 predicts that the restoring force Fy will behave as a softening-spring.

The magnetic restoring force acting on the bearing in the x-y plane is axi-symmetric about the harvester's central-line 170. If a bi-axial host acceleration is applied (i.e. in the x-y plane), then the bearing would be expected to map out a lissajous figure on the surface of the ME transducer. The rest position for the bearing is directly above the centre of the magnet, along the central-line 170. For other magnet and bearing diameters, $D_{MAGNET}$ and $D_{BEARING}$, the bearing rest position will remain at the central-line as long as $D_{MAGNET} \lesssim D_{BEARING}$. For a given ratio $D_{MAGNET}/D_{BEARING}$, the scaling laws that apply are: $F_{RESTORING} \propto D_{BEARING}$, $k \propto D_{BEARING}$, and $f_{RESONANCE} \propto 1/D_{BEARING}$.

The Comsol software was also used to visualize the static magnetic field distribution for various bearing positions. Of particular interest is the distribution of magnetic flux B in the ME transducer, since this determines the stress distribution in the transducer, and hence the voltage generated. Two dimensional modelling of the Terfenol-D nonlinear magnetostrictive response was carried out. Predicted magnetic field distributions are shown in FIGS. 3A and 3B, which magnifies the contact region between the bearing/ME transducer. In FIG. 3A the bearing is located at the central-line and contacting the middle of the upper Terfenol-D element, whereas in FIG. 3B the bearing is located 4.5 mm from the central-line in the y-direction. These figures show that the magnetic flux distribution in the upper Terfenol-D element changes significantly as the bearing changes position.

Figure 9:
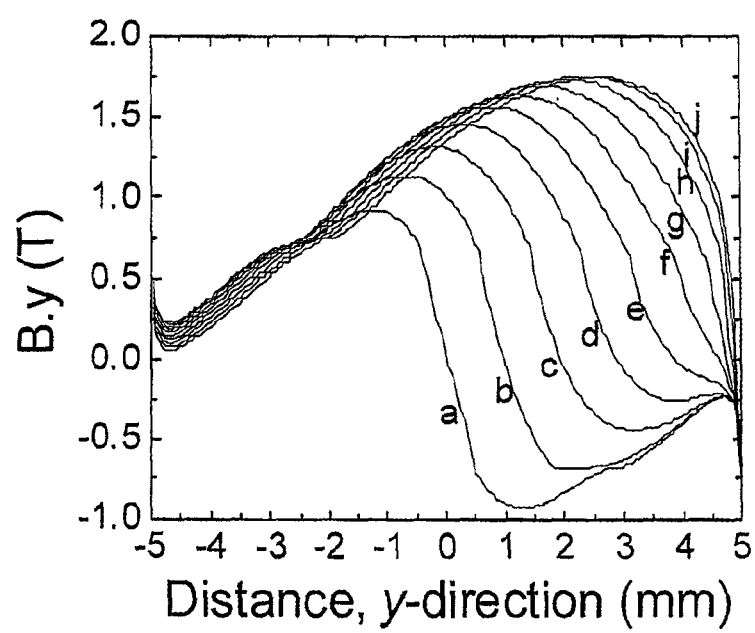
FIG. 9 is a plot of predicted magnetic flux density in the y-direction as a function of distance along a lower edge of an upper magnetostrictive element.
Figure 10:
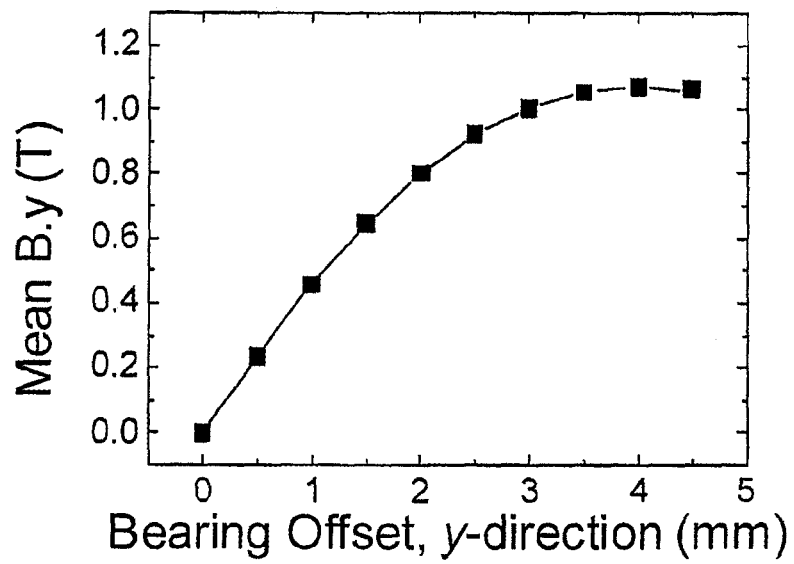
FIG. 10 is a plot of the mean magnetic flux density in the y-direction as a function of bearing offset corresponding to bearing offset lines a to j shown in FIG. 9.

A closer examination of the predictions of the magnetic flux density B, in the y-direction, for the upper Terfenol-D element is presented in FIG. 9. As the bearing moves across the surface of the upper Terfenol-D element (from the centre to the edge) FIG. 9 shows that B.y changes direction. The bearing is steering the magnetic field through the ME transducer. FIG. 10 presents the average of each B.y line (a to j) plotted in FIG. 9. The large changes in both the magnitude and direction of the magnetic flux suggest that significant strain variations are being experienced at the piezoceramic layer.

Figure 11:
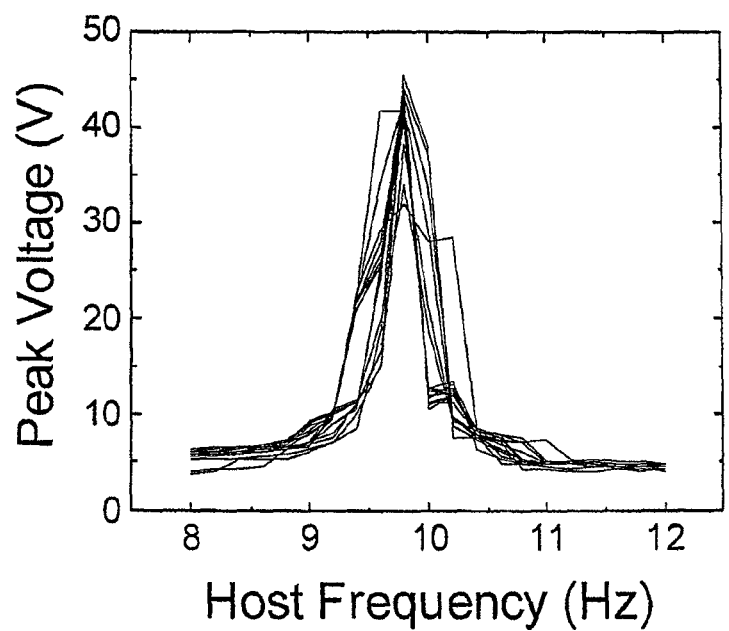
FIG. 11 is a plot of peak open circuit voltage as a function of drive frequency and angle for a device arrangement generally corresponding to FIG. 4.
Figure 12:
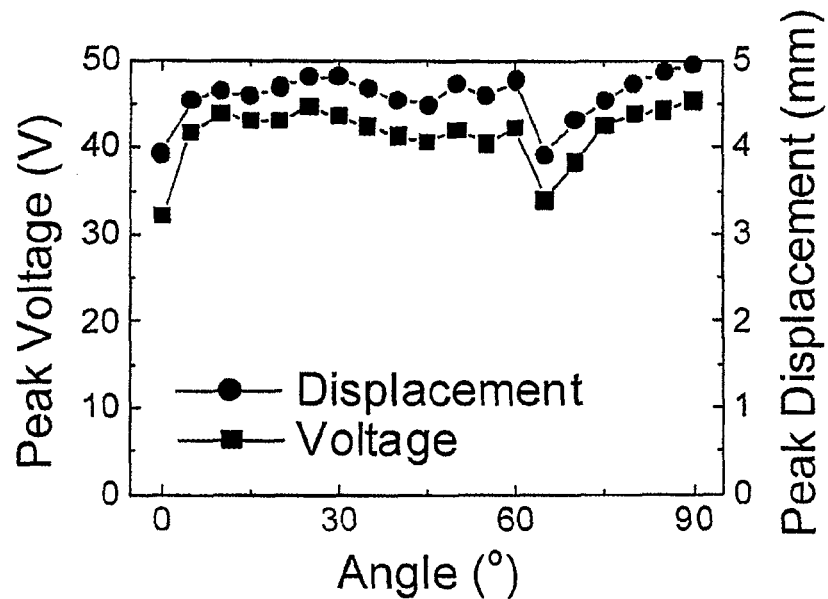
FIG. 12 is a plot of peak voltage and displacement (at resonance) as a function of drive angle.

In the experimental arrangement, the harvester device 100 (as generally depicted in FIG. 4) was attached to a 5 kg host mass, connected to a 75 N vibration shaker. A maximum RMS host acceleration of 61 mG was chosen because, at resonance, larger host accelerations would drive the bearing off the ME transducer (unless a movement limiting housing 155 is used to constrain the bearing displacement and also introduce a vibro-impact effect). The bi-axial nature of the energy harvester is clearly seen in FIGS. 11 and 12. FIG. 11 is a graph showing nineteen measured frequency sweeps of the peak open circuit voltage generated by the harvester device. Sweeps were measured from low to high frequency, in 0.2 Hz steps. A laser displacement sensor was used to measure the bearing displacement (y-direction) during testing. The host acceleration was uni-axial in the y-direction. After each sweep the harvester was rotated by 5 degrees (about the harvester's central-line) from the initial position, designated as angle 0° through to an angle of 90°. The resonant maximum of each sweep was located at 9.8 Hz, similar to the predicted resonant frequency of about 9.9 Hz predicted above. FIG. 12 shows the maximum measured peak open circuit of the sweeps shown in FIG. 11).

Figure 13:
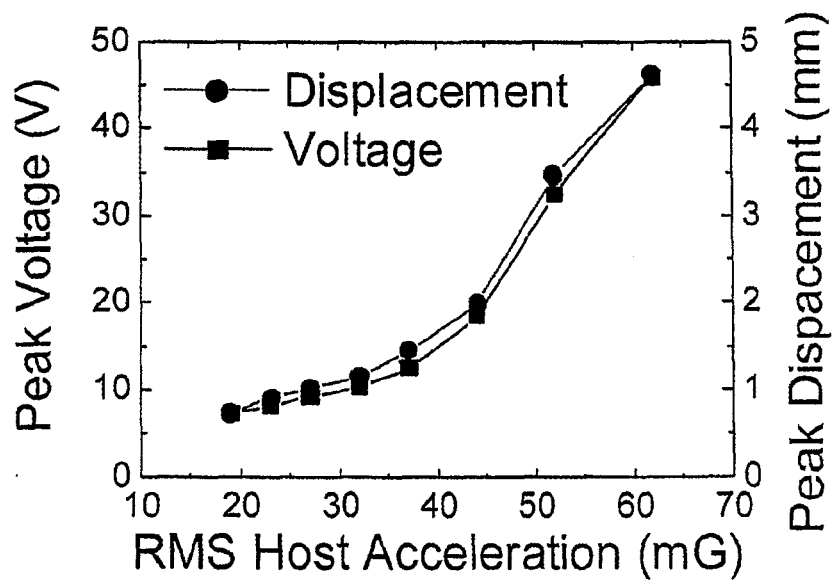
FIG. 13 is a plot of measured peak open circuit voltage and object peak displacement (at resonance) as a function of RMS host acceleration.

The peak open circuit voltage of the harvester and the peak displacement of the bearing were measured as a function of RMS host acceleration. As the host acceleration was varied, there was no significant change in the frequency of the resonant peak. FIG. 13 shows that below an RMS host acceleration of 40 mG, the measured open circuit voltages (and bearing displacement) increase in a linear fashion. There is however, a clear gradient increase for both displacement and voltage when the RMS host acceleration is larger that ~40 mG. It is surmised that the behaviour shown in FIG. 13 is due to the softening-spring effect (as described earlier, FIG. 8).

Figure 14:
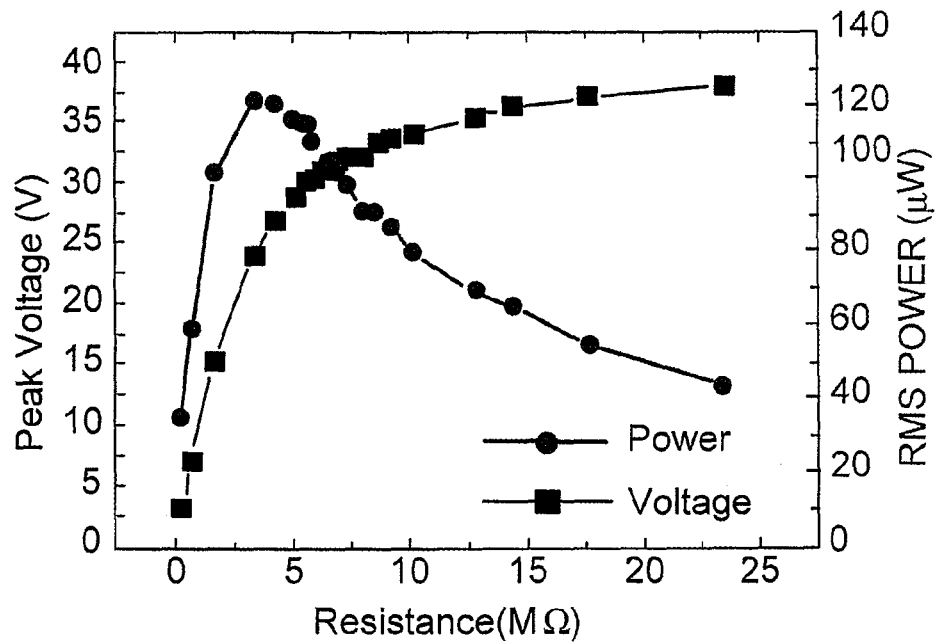
FIG. 14 is a plot of measured maximum peak voltage and RMS power as a function of load resistance.

A load resistor sweep was carried out to determine the RMS output power of the harvester. Using an RMS host acceleration of 61 mG at 9.8 Hz, the measured peak load voltage was 23.9 V across a 3.3 MΩ oad resistor, yielding a maximum RMS load power of 121 μW (as shown in the plot of FIG. 14). At the maximum load power, the measured peak bearing displacement was 4.61 mm, hence the peak kinetic energy of the 67 gram bearing is estimated to be about 2.7 mJ. Surface wear at the bearing/Terfenol-D interface has been found to be an issue for arrangements where the bearing bears directly on the upper (exposed) surface of the magnetostrictive layer 142.

In summary, a bi-axial vibration energy harvesting approach has been demonstrated that utilizes a magneto-electric transducer (Terfenol-D/lead zirconate titanate/Terfenol-D) located between an oscillating spherical steel bearing and a rare-earth magnet (NdFeB). The oscillating bearing varies the magnetic field through the ME transducer, generating an oscillating charge that can be harvested. A bi-axial device has been developed that is capable of harvesting 121 µW from an RMShost acceleration of 61 mG at 9.8 Hz. The approach described produces an effective bi-axial characteristic that may in the future be useful for kinetic energy harvesting for applications where the host accelerations are multi-axial (such as those seen in the aerospace environment).

Figure 15:
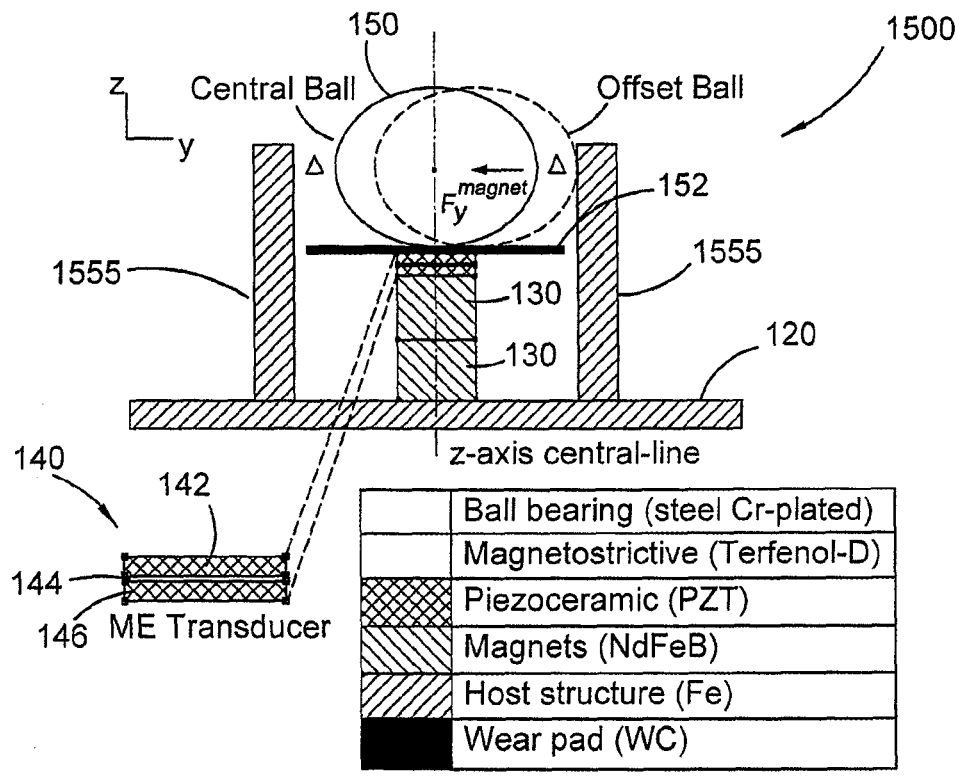
FIG. 15 is a schematic illustration of elements of a vibration energy conversion device according to some embodiments.

FIG. 15 illustrates schematically components of a device 1500 for vibration energy conversion according to further embodiments. Device 1500 is similar to device 100 in that it has the object 150 arranged similarly with respect to base 120, magnets 130, MP element 140 and preferably also a wear pad 152 interposed between the MP element 140 and the object 150. Device 1500 is also housed within a casing 110, although this is not shown in FIG. 15.

Additionally, walls 1555 are positioned around the object 150 to define a free movement volume within which the object 150 is free to move. The walls 1555 act as movement limiting structure so that translational movement of the center of mass of the object 150 laterally beyond the edge of the MP element 140 or EM coil 1740 (FIG. 17) or 2040 (FIG. 20) is restricted but not necessarily prevented. In laboratory experiments it has been observed that allowing the center of mass of a ball bearing to travel a small (compared to the bearing diameter) distance beyond the edge of the MP element 140 improves harvested energy. For MP elements, travel of the bearing a small distance past the edge serves to pull the magnetic field of the magnet 130 more horizontally (if central axis 170 is vertical), which serves to exert a stronger magnetostrictive effect on the MP element 140. For EM coils, travel of the bearing a small distance beyond the edge of the coil can be beneficial because it is desirable have the bearing travel across the coil in a way that maximizes the change in magnetic flux over time in order to maximize the current generated in the coil.

The walls 1555, which may be made of sheets or panels in a cylindrical form, for example, may be selected to have a Young's modulus less (and possibly substantially less) than that of the object 150 but preferably without exhibiting an appreciable dampening effect on oscillatory movement of the object 150 in response to vibration of the host structure 105. The material of the walls 1555 may include or be formed of aluminium, rubber or rubber like materials, alumina ceramic materials or suitable PTFE materials or similar polymers.

Although the walls 1555 provide a movement limiting function to prevent the object 150 from laterally escaping the magnetic field of magnet 130, the walls 1555 also assist in providing a vibro-impact effect that tends to broaden the frequency response of the device to vibration stimulus transferred through the host structure 105. This has been experimentally validated, as described below.

Figure 16:
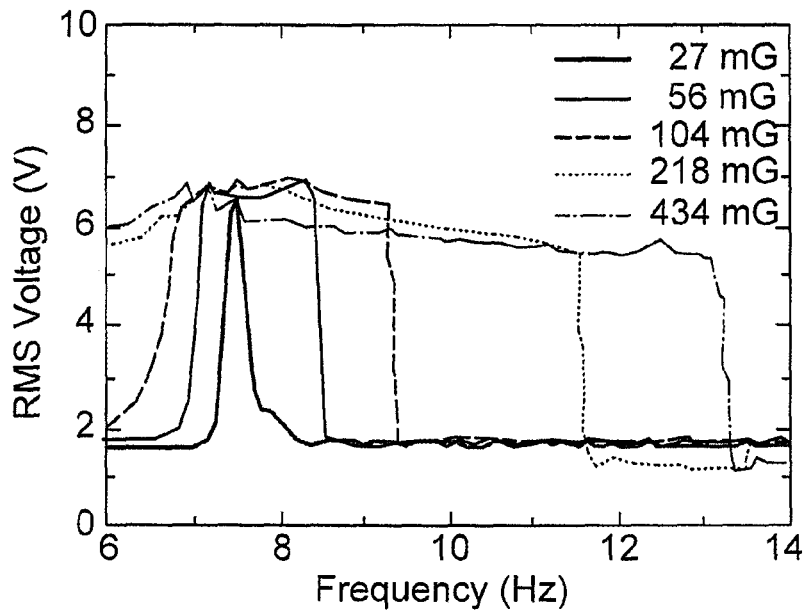
FIG. 16 is a plot of measured open circuit voltage as a function of RMS host acceleration and frequency for the vibration energy conversion device shown in FIG. 15.

FIG. 16 shows measured open-circuit voltage of the MP element 140 as a function of host acceleration and frequency using an experimental arrangement similar to that shown in FIG. 15. The data presented in FIG. 16 has been low-pass filtered with a cutoff frequency of 25 Hz.

FIG. 15 shows a schematic illustration of the permanent-magnet/ball-bearing oscillator arrangement used by the harvester, including the relative location of the ME transducer 140. A chrome-steel ball-bearing (grade AISI 52100) with a radius of 12.7 mm was used for the object 150. The bearing is allowed to roll on a 0.8 mm thick, 15 mm radius tungsten carbide (6% cobalt by mass) wear-pad 152 that is used to protect the upper surface of the ME transducer 140. The rare-earth magnets 130 (NdFeB, grade N42) and the ME transducer 140 are cylindrical, and have a radius of 5 mm.

The ME transducer 140 was formed by bonding the Terfenol-D (Etrema Products) and lead zirconate titanate elements (Ferroperm Piezoceramics Pz27) with silver loaded epoxy (Circuitworks CW2400) that was cured for two hours at 65° C. In order to maximize output from the ME transducer 140 the magnetostrictive and piezoelectric layers were made 1.5 mm and 0.5 mm thick, respectively. The magnets 130, and the piezoceramic 3-direction are poled in the z-direction. The magnets 130 are 10 mm thick, and for convenience two magnets 130 were stacked together and magnetically attached to a 5 mm thick steel base 120.

The experimental arrangement had the vibration energy harvester 1500 attached to a 5 kg host mass, connected to a 75 N vibration shaker. As shown in FIG. 15, mechanical stops (i.e. walls 1555) were created by bolting three aluminium spacers (each 3 mm thick for a total 9 mm) to each side of a steel housing with wall thickness 10 mm. During an impact event, the bearing collides with an aluminium surface, with the mechanical impulse load then transferred into the steel housing. The total inner distance between the two mechanical stops was 32.5 mm. Given that the bearing radius was 12.7 mm, the stop-gap distance is calculated as Δ~(32.5−2×12.7 mm)/2~3.5 mm.

An accelerometer mounted on the 5 kg host mass was used to set the desired RMS host acceleration, at host frequency 7.5 Hz, prior to sweeping the frequency. Frequencies from 6 Hz to 14 Hz were swept in 0.1 Hz steps. Host frequencies below 6 Hz were not examined due to frequency limitations of the vibration shaker. Host acceleration variation was within ±10 mG during a sweep (where 1 G=9.8 m/s$^2$). Dwell time at each frequency was 10 seconds, after which time the next frequency step was immediately applied (with care taken to ensure a smooth transition between frequency steps). Voltage and power measurements were made using a differential probe and oscilloscope. The measurement sampling rate was 12 kSPS. The measured capacitance of the ME transducer 140 was 1.86 nF, suggesting an impedance at 8 Hz of $X_C=1/(2\pi f C)$~10.7 M. This impedance is larger than the 8 MΩ input impedance of the differential probe (Hameg HZ109), so a large resistance (90 MΩ) was added in series with the probe to ensure that the transducer voltages were measured accurately.

As shown in FIG. 16, for the smallest host acceleration used, 27 mG, there was little or no interaction between the harvester's oscillating bearing and the mechanical stops (i.e. no vibro-impact), and hence the half-power frequency bandwidth is a relatively narrow ~0.23 Hz and centered at 7.5 Hz. The measured central frequency of 7.5 Hz is marginally lower than the predicted resonant frequency of 8.1 Hz, presumably because of the softening-spring effect. As the host acceleration is increased, a vibro-impact process between the bearing and the aluminum stops occurs, producing an increase in the operational frequency bandwidth of the vibration energy conversion device 1500. The largest host acceleration used, 434 mG, produced the largest bandwidth, ~7.2 Hz, approximately 31 times greater than the bandwidth observed using a 27 mG host acceleration. The amount of frequency bandwidth increase is governed by the physical process of vibro-impact, which is a non-linear effect.

As stated above, in some embodiments, MP element 140 may be substituted for a different transducer element in the form of an electromagnetic coil for generation of a potential difference across output conductors 708. Examples of energy harvesting devices 1700 and 2000 using EM coils as a transducer element are shown and described in relation to FIGS. 17 and 20.

Figure 17:
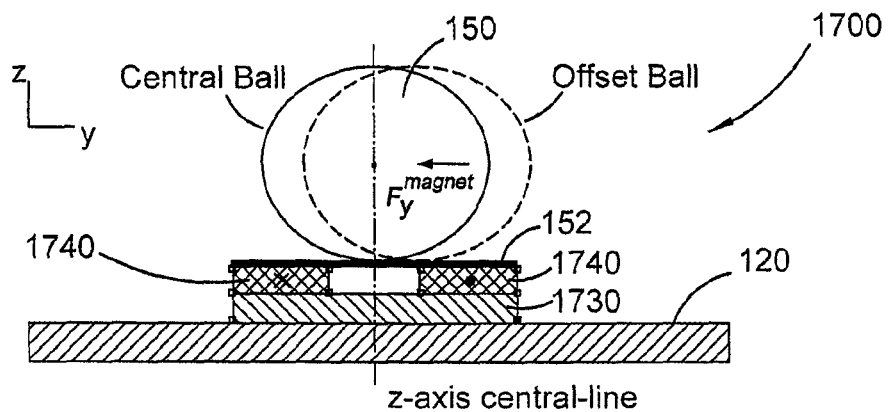
FIG. 17 is a schematic illustration of elements of a vibration energy conversion device according to further embodiments.

Referring in particular to FIG. 17, energy harvesting device 1700 is shown schematically to include the untethered movable object 150 (as a ball bearing) attracted by a disc magnet 1730 affixed to a base 120. The magnet 1730 supports an EM coil 1740 that is interposed between the magnet 1730 and the object 150. A wear pad 152 is positioned over the EM coil 1740 to protect it from wear and to allow the object 150 to move (roll) with relative freedom. Thus, variations in the magnetic field of the magnet 1730 due to movement of the object 150 affect the magnetic field of the EM coil and induce a current in the EM coil. This current can then be harvested, stored and used to power another device in the manner described above in relation to FIG. 7.

Depending on the arrangement of the outputs of the EM coil, the electronics between the harvesting device 1700 or 2000 and the rechargeable power supply 720 may need to be adapted to suitably process and harvest the output power. For example, circuitry 709 may include a step-up voltage transformer in order to provide a useable output voltage to the rechargeable power supply 720 (or other power sink).

To test the possible use of the magnet/coil transduction mechanism, the arrangement 1700 depicted schematically in FIG. 17 was examined. The static magnetic field arrangement was modelled using Comsol, and then a prototype was built and experimentally tested.

Referring to FIG. 17, as the bearing oscillates in the x-y plane (where x is normal to the page) the magnetic field distribution in the coil changes. FIG. 17 illustrates one possible non-optimised coil orientation. Different coil configurations may be employed to greater or different effect. For example, a segmented EM coil arranged as a toroid about a donut-shaped magnet may be used, as described below in relation to FIG. 20. Additionally, more than one EM transducer may be employed, with multiple EM transducers disposed near the magnet and object 150 to have their magnetic fields affected by movement of the object 150, for example in a similar manner to the arrangements shown in FIGS. 5 and 6. However, arrangements other than those of FIGS. 5 and 6 may be employed.

Figure 18:
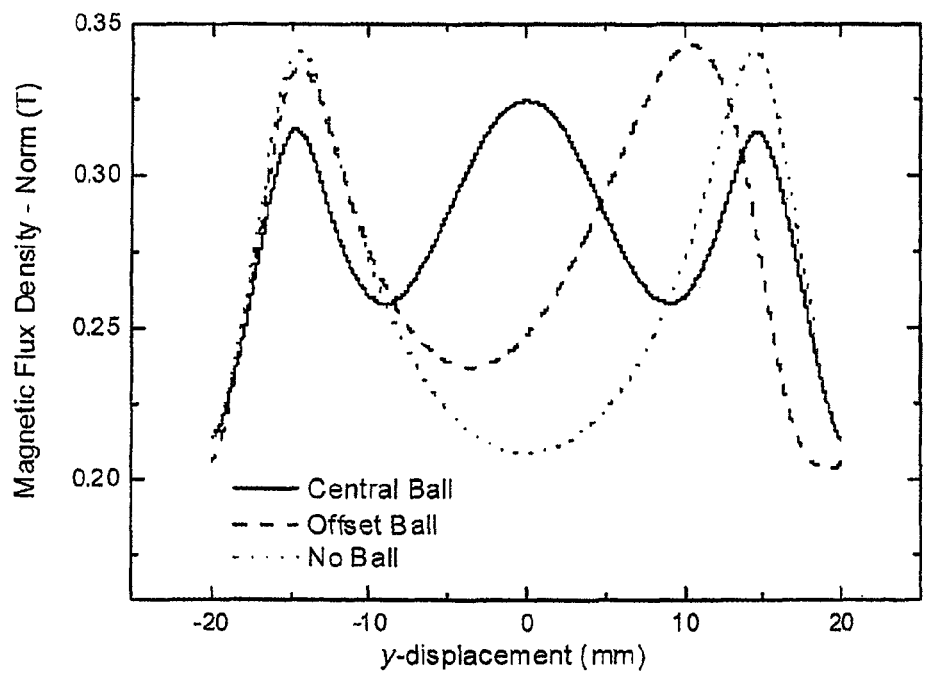
FIG. 18 is a plot of predicted static magnetic flux density for three different object states for the vibration energy conversion device shown in FIG. 17.

For the arrangement 1700 shown in FIG. 17, FIG. 18 shows the predicted static magnetic flux density for three bearing arrangements: the bearing 150 in a centered position ('Central Ball'); the bearing displaced from that position ('Offset Ball') at y=15 mm; and with no bearing. As the bearing 150 moves from its rest position towards the edge, a region of varying magnetic field passes through the coil, which in turn induces a time-varying current in the coil that generates a voltage across an attached load resistance.

An experimental arrangement similar to that shown in FIG. 6a was investigated. A chrome-steel ball-bearing (grade AISI 52100) with a diameter of 25.4 mm was used, and a 30 mm diameter tungsten carbide (6% cobalt by mass) wear-pad was used to protect the upper surface of the wound coil and to provide a surface for the bearing to move on. A 238 turn coil was wound from copper wire with diameter 300 μm, and had a measured inductance of 4.1 mH and a measured resistance of 7.5Ω. The coil had a height of 4.2 mm, with an approximate outer diameter of 30 mm and inner diameter of 10 mm. For the system described, Comsol magnetic field predictions (as shown in FIG. 18) indicated a field differential of approximately 100 mT as the bearing moves from the central position to an edge (15 mm from the centre). The 10 mm inner coil diameter was chosen since it is similar to the width of the middle magnetic flux peak for the Central Ball as shown in FIG. 18.

Figure 19:
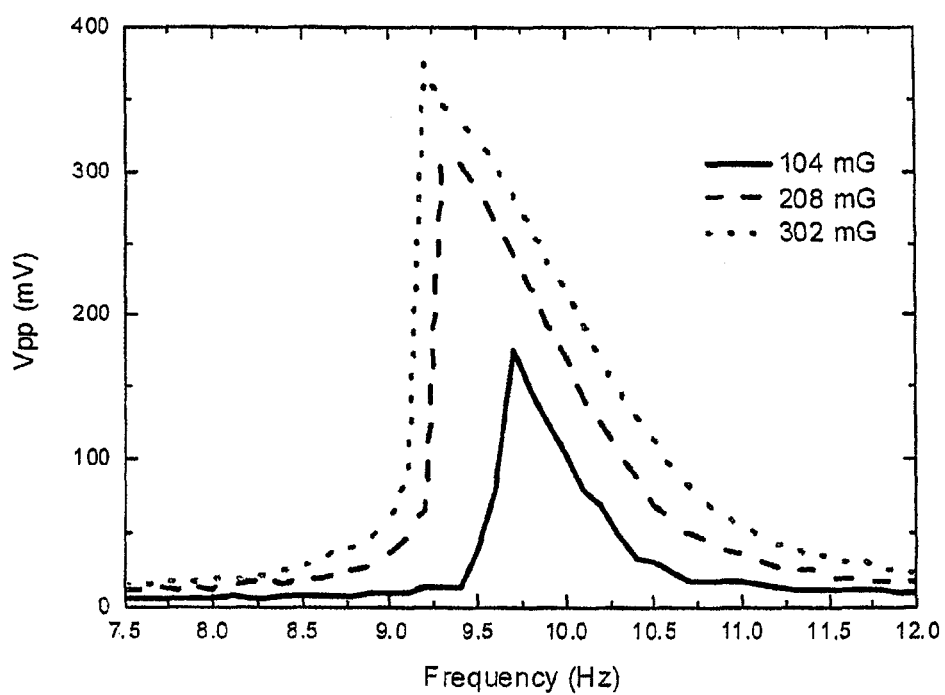
FIG. 19 is a plot of measured peak to peak coil voltage across an optimised load for the vibration energy conversion device shown in FIG. 17.

A near optimum resistive load of 7.5Ω was applied and, as shown in FIG. 19, a series of sweeps were carried out to determine the output voltage and power from the harvesting arrangement. For the three host acceleration levels shown in FIG. 19, the frequency was swept upwards through the range 7.5 and 12 Hz in 0.1 Hz steps, with a 10 second dwell at each frequency step.

The measured results shown in FIG. 19 are peak-peak coil voltages across an optimised 7.5Ω resistive load using the harvesting arrangement 1700 of FIG. 17, and show a softening resonant response. As the host acceleration increases, so does the resonant displacement amplitude of the bearing, producing larger output voltages across the optimised load. Table 1 below summarises the measured response from the harvesting arrangement, and shows that the measured maximum RMS output power was 2.5 mW for an RMS host acceleration of 302 mG at 9.2 Hz.

TABLE 1

Summary of measured results from magnet/coil harvesting arrangement.

| RMS Host Acceleration (mG) | Frequency Response Range (Hz) | | Band (Hz) | Maximum Vpp (mV) | RMS Maximum Power (mW) |
|---|---|---|---|---|---|
| 104 | 9.6 | 10.3 | 0.7 | 173.8 | 0.54 |
| 208 | 9.3 | 10.4 | 1.1 | 305.9 | 1.67 |
| 302 | 9.2 | 10.5 | 1.3 | 374.2 | 2.50 |

It has been observed that for certain bearing/magnet geometries and at certain host frequencies and accelerations, the described bi-axial magnet/bearing harvesting arrangement has a tendency to produce elliptical (or circular) ball-bearing displacements (or orbits). This tendency can be exploited to convert a translational host acceleration into an elliptical ball displacement. Using a wire coil of appropriate geometry as the mechanical-to-electrical transducer this can form the basis of a bi-axial vibration energy harvester.

A schematic illustration of an arrangement 2000 of this type of vibration energy harvesting device is shown in FIG. 20. A ball bearing 150 moves on a wear pad 152 mounted directly over a coil transducer 2040. For the example configuration shown in FIG. 20, a toroidal coil 2040 is shown wound around a donut shaped (annular) magnet 2030 (with the magnet poled in the vertical z-direction, normal to the plane of the wear pad 152 and base 120). The host acceleration acts in the x-y plane, as indicated by arrows 2020. The center frequency is:

$$f_R = (1/2\pi)\sqrt{k_r^{magnet}/M}$$

where the bearing mass is M (kg), and $k_r^{magnet}$ (N/m) is the small amplitude spring constant of the magnetic force (in the x-y plane) acting on the bearing 150. For host accelerations with frequencies close to $f_R$ the bearing 150 may begin to undergo a resonant motion in the form of an elliptical displacement. Interestingly, once a resonant ball motion has been established, then the host frequency may be varied over a wideband and the ball bearing's resonant motion is maintained.

The use of a suitable configured coil in an arrangement such as that shown in FIG. 20 offers the prospect of frequency up-conversion, whereby a low frequency mechanical excitation may be converted into a higher frequency electrical output that can be beneficial for vibration energy harvesting. Additionally, a harvester with a suitably arranged coil, such as the toroidal coil 2040 shown in FIG. 20, may remove the necessity for signal rectification, thus improving harvester efficiency and also simplifying the harvesting electronics in between the device 2000 and the rechargeable power supply 720.

Although FIGS. 17 and 20 do not specifically show movement limiting structure to limit movement of the object 150 past the edge of the wear pad 152, it is intended that such movement limiting structure be provided as shown in FIGS. 1A, 1B, 15 or in another suitable form. Similarly, the magnet, EM coil and bearing arrangement of FIGS. 17 and 20 are suitably enclosed by housing structure, for example in the manner described above in relation to FIGS. 1A, 1B, 4, 5 and 6.

Embodiments described above may additionally include one or more further magnets positioned laterally adjacent the magnet 130, 1730 or 2030 in combination with a wear pad or other extended surface that allows the object 150 to travel close enough to the one or more additional magnets that the object becomes more attracted to one such magnet and tends toward a point of stability (absent externally applied vibration) adjacent that magnet. For such embodiments, the at least one transducer element includes one or more additional MP element 140 or EM coil 1740, 2040 arranged adjacent the additional magnet or the at least one transducer element (embodied as an MP element 140 or EM coil 1740, 2040, for example) is made large enough to be affected by changes in the magnetic field of the additional magnet. This arrangement may be described as being bi-stable or multi-stable as it may use two or more points of stability corresponding to peak magnetic attraction of the underlying magnets 130, 1730 or 2030.

Embodiments are contemplated in which an EM coil 1740, 2040 and MP element 140 may be used in combination as transducers positioned to harvest energy due to movement of the same object 150 within a single vibration energy harvesting device.

Figure 22:
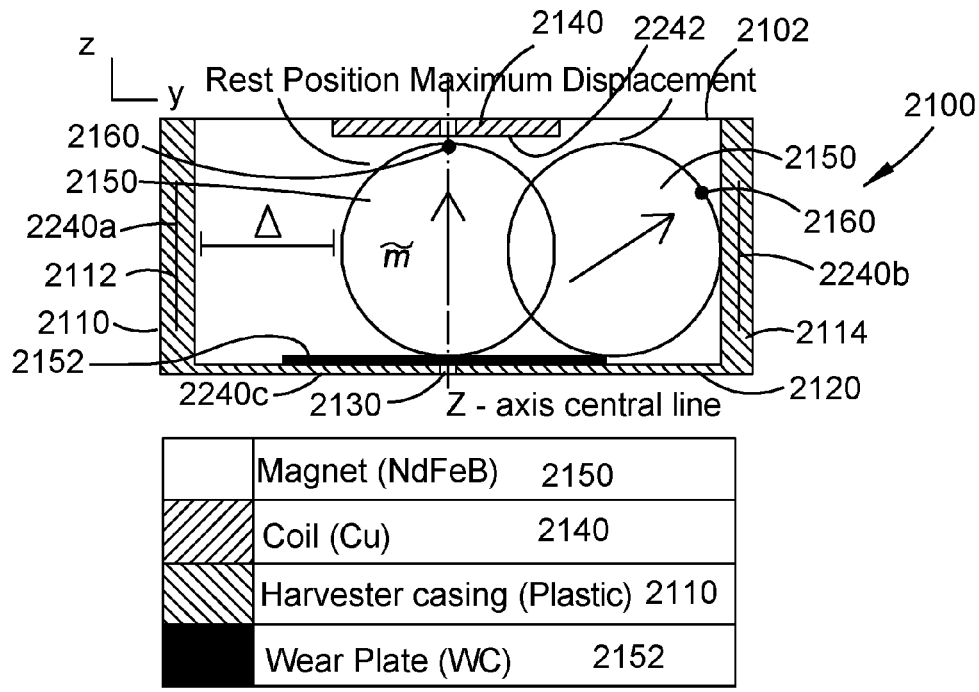
FIG. 22 is a schematic illustration of components of a vibration energy conversion device of FIG. 21.

Referring now to FIGS. 21 and 22, an energy conversion device 2100 according to some embodiments is described in further detail. FIG. 21 shows device 2100 in an exploded configuration. Device 2100 has a housing or casing 2110 with a base 2120 and a lid 2102 cooperating to define an enclosed volume within the casing 2110. The lid 2102 (or other wall of the casing 2110) may be removable from the remainder of the casing 2110 to allow access to the interior of the casing 2110. A movable magnet 2150 is free to move within the casing 2110 in at least two degrees of freedom (i.e. translational and rotational). The movable magnet 2150 may be in the form of a rare earth magnet shaped as a ball bearing, for example.

A ferromagnetic object 2130 is provided in a base of the casing 2110 and is fixedly positioned relative to the casing 2110. The ferromagnetic object 2130 may be magnetised (poled) or unpoled and is configured to allow magnetic attraction between the magnet 2150 and the ferromagnetic object 2130 so that the magnet tends to return to a central rest position (as shown in FIG. 22) immediately adjacent the ferromagnetic object 2130 when the device 2100 is not experiencing vibration. Some embodiments may include more than one ferromagnetic object 2130 positioned in the base of the casing 2110 and arranged to attract the magnet 2150 toward the rest position.

Embodiments described and depicted in FIGS. 21 and 22 generally employ a metallic spherical ball bearing as the movable magnet 2150. However, another form of rounded magnet may be employed in alternative embodiments, including solid or partially solid objects. Such rounded forms include, for example, spheroid, part-spheroid, frusto-spheroid, ovoid and part-ovoid objects. The ball bearing described herein may be formed of Neodymium or Samarium-Cobalt, for example. In a specific embodiment, the magnet 2150 may be a spherical neodymium iron boron magnet (NdFeB, grade N42, vertically poled with 25.4 mm diameter). The remanent field of the magnet 2150 is preferably at least 1.0 T and may be up to about 1.4 T. However, objects 150 of other magnetically responsive materials may be employed instead. If a spherical bearing is used as the magnet 150, it may have a diameter of about 15 mm to about 30 mm, for example. Preferably, the diameter is about 20 to 25 mm or around 1 inch in diameter.

Casing 2110, including base 2120 and lid 2102 but excluding the magnet 2150 and the ferromagnetic object 2130, may comprise (or be almost entirely formed of) a plastic material. Alternatively, the casing 2110 may be partially magnetically conductive or it may be ferromagnetic and may include a non-conducting/high resistivity material, such as a polymer made with iron filings. Casing 110 may be generally cylindrical, cuboid or rectanguloid in form, for example. For illustration purposes, a rectanguloid casing 2110 is shown in FIG. 21.

Casing 2110 may be mounted on or otherwise coupled to a host structure 105 to have a chosen horizontal, vertical or angled orientation. Host structure 105 may be any suitable structure to which described energy conversion devices may be usefully coupled. The casing 2110 is fixedly coupled, either directly or indirectly, to the host structure 105 so that movement of the host structure 105 causes corresponding movement of the casing 2110 and its contents (other than the untethered object 2150).

As shown in FIG. 22, the magnet 2150 is disposed within the enclosed volume of casing 2110 in proximity to the ferromagnetic object 2130 and an EM transducer 2140. The EM transducer 2140 is fixedly positioned in or on the top (lid) 2102 of the casing 2110. The EM transducer 2140 is positioned on an opposite side of the magnet 2150 from the ferromagnetic object 2130 (when the magnet 2150 is in the rest position), so that the magnetic field emanating from the magnet 2150 passes through the EM transducer 2140. The relative positioning of the magnet 2150, EM transducer 2140 and ferromagnetic object 2130 are preferably selected to generally maximise the degree to which changes in position of movable magnet 2150 are converted into electrical potential by the EM transducer 2140. When the magnet 2150 is at the rest position, the magnet 2150 and the EM transducer 2140 are separated by an air gap, wherein the gap is between about 0.5 mm and about 3 mm, optionally about 1 mm.

Device 2100 may also comprise a movement limiting structure distinct from the walls of the casing 2110 so that the magnet 2150 is not allowed to move beyond where the ferromagnetic object 2130 can exert a magnetic restoring force on the magnet 2150. Alternatively, walls of the casing 2110 may act as a movement limiting structure. All or a portion of the walls of casing 2110 may be ferromagnetic to magnetically shield external objects from magnet 2150. The movement limiting structure may be configured to serve as a 360° mechanical stop and may be provided by a non-magnetic cup-shaped element 155 (as in FIG. 1A) having an interior surface 156 defining a central cavity within which the magnet 2150 is receivable in a similar manner to that shown in relation to FIGS. 1A and 1B. The cup-shaped element 155 may also have a passage or recess 158 formed at the apex or bottom of the cavity to house the ferromagnetic object 2130 in close proximity to the rest position of the magnet 2150. In some embodiments, the passage or recess 158 may provide a thin layer of material, such as a wear pad 2152, between the ferromagnetic object 2130 and the magnet 2150 in order to mitigate wear on the ferromagnetic object 2130 by movement of the object 2150.

The wear pad 2152 may comprise a thin planar disc of a hard material having a high Young's modulus (e.g. around 350 GPa or higher) and resistant to wear by the magnet 2150 as the magnet 2150 travels across the surface of the wear pad 2152, for example. The hard material of the wear pad 2152 thus may act as a solid base for the magnet 2150 to roll on. The Young's modulus of the hard material of the wear pad 2152 should be higher than the Young's modulus of the magnet 2150. The hard material of the wear pad 2152 may be substantially non-ferromagnetic or slightly ferromagnetic. The hard material of the wear pad may be tungsten carbide or aluminium oxide, for example. If a tungsten-carbide material is used in the wear pad 2152, this may assist in retaining the magnet on the wear pad 2152, since tungsten-carbide is slightly ferromagnetic. The wear pad 2152 may have a diameter of around 20-30 mm and a thickness of about 1.0 to 0.5 mm or possibly about 0.8 mm. Preferably, there is a low coefficient of sliding friction and rolling friction between the magnet 2150 and the wear pad 2152. A dry or fluid lubricant may be added at the interface between the magnet 2150 and the wear pad 2152. The hard material of the wear pad 2152 may have an aperture formed therein to accommodate the ferromagnetic object 2130 therein or the ferromagnetic object 2130 may be positioned directly under the wear pad in the base 2120.

In some embodiments, the wear pad 2152 may comprise a thin substantially planar elastomeric layer on top of the hard material, so that the elastomeric layer bears the direct contact with the magnet 2150. The elastomeric layer may have a thickness of about 0.5 to about 2.0 mm (optionally around 1.0 mm), for example. The elastomeric layer may be formed of a rubber material, for example such as natural rubber or butadiene rubber.

In other embodiments, some kind of coating or lubricant may be applied to the magnet 2150, wear pad 2152 or otherwise used to mitigate wear and/or affect the coefficient of friction between the magnet 2150 and the ferromagnetic object 2130 or other components within the casing 2110.

In some embodiments, the EM transducer 2140 may comprise multiple EM coils or may comprise a series of sub-coils, each independently providing its electrical potential output in response to changes in the magnetic field passing therethrough from the magnet 2150.

Some embodiments of device 2100 may employ multiple EM transducers 2140 at spaced locations on, in or around the casing 2110. Such an arrangement may include, for example, at least one EM transducer 2240c positioned around the ferromagnetic object 2130 at or adjacent the base 2120 (similar to FIG. 17 or 20) of the casing 2110, at least one EM transducer 2240a, 2240b in or on (e.g. flush with) the interior of one or both lateral side walls of the casing 2110 in a configuration similar to that shown in FIG. 6 but disposed at a right angle orientation to the EM transducers 2140 in or on the top 2102 and/or base 2120. Each such EM transducer 2240a, 2240b, 2240c may include multiple sub-coils. Each such EM transducer 2240a, 2240b, 2240c may have a thin protective coating or layer 2242 thereon to protect it from contact with the magnet 2150. However, it is not intended that such contact would regularly occur since the magnet 2150 is intended to be attracted back to toward its rest position adjacent the ferromagnetic object 2130, which functions as a kind of magnetic tether on the magnet 2150. The thin protective layer or coating 2242 is preferably mechanically robust and non-ferromagnetic and may have a thickness of around 0.5 to 1.0 or 2.0 mm. Example materials for such a protective layer may include an Alumina or hard polymer/elastomer coating.

In some embodiments, the movable magnet 2150 may be replaced with a movable magnetic object 2550, as shown in FIG. 25. FIG. 25 schematically illustrates an alternative configuration of a vibrational energy conversion device 2500 similar to device 2100 but employing the magnetic object 2550 with multiple magnetic elements 2555 in place of a single magnet 2150. The round magnetic object 2550 may be constructed of two or more collocated magnetic elements (e.g. rare earth magnets) 2555 mounted in a rounded object and disposed to be arranged around the outside of the magnetic object 2550 in spaced relation to each other, for example in a Halbach array. The rounded object may comprise a polymer or rubber material as an outer shell 2554 and may contain a core 2558 of high density material, such as lead. Otherwise, the device 2500 employs a ferromagnetic object 2530, a casing 2510 with a base 2520 and at least one EM transducer 2540 in a similar manner to the ferromagnetic object 2130, casing 2110 and at least one EM transducer 2140 described above.

Experiment

Experiments were conducted in relation to a hybrid rotary-translational vibration energy harvesting approach based on the embodiments described and depicted in FIGS. 21 and 22. This approach exploits cycloidal motion to achieve a relatively high power density from an oscillatory kinetic energy harvester operating at frequencies below 10 Hz. The approach uses a rolling magnetic sphere (magnet 2150). The rolling motion mechanically amplifies the velocity at which the magnetic pole of the sphere passes a nearby coil transducer (EM transducer 2140), inducing a proportionally larger electro-motive force across the coil. A prototype cycloidal energy harvester has been shown to produce an rms power of 141 mW from a host vibration of 500 milli-g rms at 5.4 Hz.

Vibration energy harvesting is a rapidly maturing field of study, and is an electrical powering technique that is being applied across a diverse range of applications such as structural health monitoring, pacemakers, sensors for railway cars, short range RF communications, and bird tracking. There are three main parameters that determine the practicality of the vibration energy harvesting approach for powering autonomous electronic devices: (i) output power, (ii) physical size, and (iii) operational bandwidth. The volume power density of a vibration energy harvester (or generator) is an often used metric for comparing harvester designs since it is often the most important design parameter for applications requiring a small device footprint (i.e. mass and size). Although new approaches for increasing the power density are regularly reported, there is still a striking difference between the power density of rotational generators (maximum ~100 $W/cm^3$) compared with those relying on oscillatory translational motion alone (maximum ~0.1 $W/cm^3$). The size of a translational generator will limit the amount of electrical power that it can produce, primarily due to a displacement restriction on the travel of inertial mass. For electromagnetic generators, this displacement restriction in turn limits the velocity of the inertial mass and hence the electro-motive force (e.m.f.) that can be induced across a coil-transducer (the velocity restriction does not apply to rotational generators). The vibrational energy harvester outlined in this description is a hybrid rotary-translational device that uses cycloidal motion to combine a rotational aspect to an oscillatory based design.

The cycloidal harvesting mechanism investigated in the experiment permits a relatively small resonant harvesting device to approach the theoretical power limit described in the literature, $$P_e = \frac{m\,a^2}{8\omega_r} Q_{OC}, \tag{1}$$

where $P_e$ is the electrical power produced by a harvester with seismic mass m, resonant frequency $\omega_r$, open circuit mechanical quality $Q_{OC}$, driven by a host acceleration a. Equation 1 assumes that the harvesting device is sufficiently large so that seismic mass m can 'ring-up' to steady-state displacement amplitude which is approximately determined by $Q_{OC}$. At low host frequencies, the travel required by the seismic mass (at steady-state resonance) can be large which may not be compatible with smaller micro-machined devices.

FIG. 21 shows a perspective drawing of the harvester under investigation. A spherical neodymium iron boron magnet (NdFeB, grade N42, vertically poled with 25.4 mm diameter) is placed above a tungsten carbide wear pad (grade K20, 38 mm diameter, 0.8 mm height). A small second NdFeB magnet (as one example of ferromagnetic object 2130, formed as a cylinder, 3 mm diameter, 1 mm height) is located below the midpoint of the wear-pad, magnetically tethering the sphere to the center of the wear-pad. A copper coil (as one example of the EM transducer 2140, having 3300 turns, 27 mm diameter, 2 mm height) with a measured inductance and resistance of 92 mH and 680Ω respectively is positioned above the sphere, allowing for a clearance gap of ~1 mm. A plastic rectangular casing with an inner length of 63.4 mm allows the sphere to reach a full displacement of 4=19 mm from its central point in they direction (FIG. 22). The casing width of 31.4 mm encourages the sphere to maintain linear motion, while a height of 30 mm ensures the clearance conditions of the coil are met. As the sphere rolls, the magnetic pole (point 2160 in FIG. 22, henceforth called 'the pole') sweeps past the coil, hence inducing an e.m.f.

FIG. 22 is a schematic illustration showing a side-elevation of the cycloidal vibration energy harvester. The sphere rolls from the middle 'rest position' to its 'maximum displacement' A corresponding to a poling angle of θ=85.7 degrees from the vertical. Host vibration is in the x-y plane (where x is normal to the page).

The mechanical advantage of using cycloidal motion can be shown by comparing a rolling with a non-rolling (e.g. sliding) magnetic sphere. For a rolling magnetic sphere, the displacement of the magnetic pole (indicated by the point 2160 in FIG. 22) in the y direction is $y=s+y_R$, where $s=R\,\theta$ is the translational displacement and $y_R=R\sin\theta$ is the rotational displacement for a sphere with radius R, and with angle θ. The parametric representation of cycloid motion for the pole in the y direction is found to be, $y=R(\theta+\sin\theta)$. The velocity (y direction) of the pole for a rolling magnetic sphere is then $v_P=dy/dt=ds/dt\,(1+\cos\theta(t))$. The velocity of the pole will be greatest near the center of the coil where a small θ approximation can be made, and $v_P \approx 2\,ds/dt\,(1-\theta^2/4+\ldots)$. For a non-rolling magnetic sphere $y=s$ and the translational velocity of the sphere's center of mass (i.e. without rotational displacement) is simply ds/dt. Hence for a rolling magnetic sphere the pole is travelling with twice the velocity compared with a non-rolling magnetic sphere. This increase in velocity of the magnetic pole produces a corresponding increase in e.m.f induced in the coil.

Predictions of the e.m.f induced in the coil by the rolling magnetic sphere can be made using Faraday's law of induction. It is assumed that the sphere is oscillating in steady-state with a displacement of s(t), and that the coil transducer is open-circuit. Neglecting the effect of the wear-pad and the tether magnet the external magnetic field $\tilde{B}(\tilde{r})$ in the vicinity of the coil is described by the equation for a uniformly magnetized sphere with a magnetic dipole moment $\tilde{m}$ (as depicted in FIG. 22), $$\tilde{B}(\tilde{r}) = \frac{\mu_0}{4\pi}\left(\frac{3(\tilde{m}\cdot\tilde{r})\tilde{r}}{r^5} - \frac{\tilde{m}}{r^3}\right), \tag{2}$$

where $\mu_0$ is the permeability of free space, $\tilde{m}=m_x\hat{i}+m_y\hat{j}+m_z\hat{k}$, the position vector is $\tilde{r}=x\hat{i}+(y-s)\hat{j}+z\hat{k}$ since the center of the dipole has translated by a distance (y−s), $\hat{i},\hat{j},\hat{k}$, are orthogonal unit vectors in the x, y, and z directions respectively, and $r=|\tilde{r}|$. For the sphere rolling in the y direction $m_x=0$, $m_y=|\tilde{m}|\sin(s/R)$, and $m_z=|\tilde{m}|\cos(s/R)$, so the vertical magnetic field component at the mid-plane of the coil $z=z_0$ as a function of the distance that the sphere has rolled (s) is found to be, $$\tilde{B}_Z(x, y, z_0) = \tag{3}$$
$$\frac{\mu_0|\tilde{m}|}{4\pi}\frac{3z_0\sin(s/R)(y-s)-\cos(s/R)(x^2+(s-y)^2-2z_0^2)}{(x^2+(s-y)^2+z_0^2)^{5/2}}\hat{k}.$$

Converting to cylindrical polar coordinates, $x=\rho\cos(\phi)$ and $y=\rho\sin(\phi)$, to allow calculation of the magnetic flux through a multi-turn coil, the e.m.f. induced in the coil by the rolling sphere as a function of time is, $$e.m.f. = -\frac{N}{a_2-a_1}\frac{ds}{dt}\int_{a_1}^{a_2}da\int_0^\rho \rho\,d\rho\int_0^{2\pi}d\phi\frac{\mu_0|\tilde{m}|}{4\pi}\times\frac{d}{ds} \tag{4}$$
$$\left(\frac{3z_0\sin(s/R)(\rho\sin(\phi)-s)-}{\cos(s/R)(\rho\cos(\phi))^2+(s-\rho\sin(\phi))^2-2z_0^2)}\right),$$

where N is the total number of coil turns, $a_1$ and $a_2$ are respectively the inner and outer radii of the pancake coil, $|\tilde{m}|=(4\pi/3)R^3 M$ and magnetization M=0.995 MA/m (the operating point of this N42 grade NdFeB magnet). Equation (4) can be evaluated numerically, and describes the electrical behaviour of the harvester shown in FIG. 22. Here the sphere is assumed to be oscillating harmonically and the maximum displacement is 19 mm (the radius of the wear-pad). A full electromechanical model of the harvester is beyond the scope of this description.

The prototype vibrational energy harvester was mounted on a 'host' platform with an approximate mass of 5 kg, which was attached to a 200 N electromagnetic vibration shaker. Host acceleration frequency sweeps were performed to compare the open circuit e.m.f. predictions with measurements. Open circuit harvester voltage was monitored as the host frequency was swept between 5.5 and 7.5 Hz (at 0.1 Hz/s) with a host acceleration of 500 milli-g (where 1 g=9.8 ms$^{-2}$). For a sweep where the host vibration frequency was 5.85 Hz, there was shown to be good correlation between the predicted and measured load voltage (open circuit). The frequency of the load voltage is twice the mechanical frequency of the sphere.

Multiphysics finite element analysis software (Comsol 4.3b) was used to determine the static magnetic restoring force $F_y$ acting on the sphere (2150) in the prototype harvester. A relative permeability of $\mu_r=10$ was assumed for the WC wear-pad (2152), and the effect of the tether magnet (2130) was included. As the magnetic sphere moves away from the centre of the wear-pad, and centre magnet, the restoring force $F_y$ behaves like a softening spring of the form, $$F_y = k_1 y + k_3 y^3 + k_5 y^5$$

with spring constants $k_1=-303$ N m$^{-1}$, $k_3=-2.5\times10^5$ N m$^{-3}$, and $k_5=1.7\times10^9$ N m$^{-5}$. The mass of the magnetic sphere is approximately 64.3 grams. Taking rotational inertia into account, the resonant frequency of the sphere is $f=(1/2\pi)\sqrt{k/m(1+2/5)}\sim9.2$ Hz, when $y\le15$ mm. This is the upper resonant frequency limit, as the displacement of the sphere is increased the softening-spring effect reduces the resonant frequency. Dynamically, the addition of a matched electrical load R is expected to alter the restoring force, since the coil current will produce an electromagnetic force that acts against the sphere. Open circuit displacement ring-downs were used to find the effective mechanical quality Q of the rolling sphere, which was found to be $Q_{OC}\sim47$ at large displacements, and increasing to $Q_{OC}\sim500$ at small displacements. This observation is consistent with the literature, where it is known that the coefficient of rolling friction varies with speed.

Figure 24:
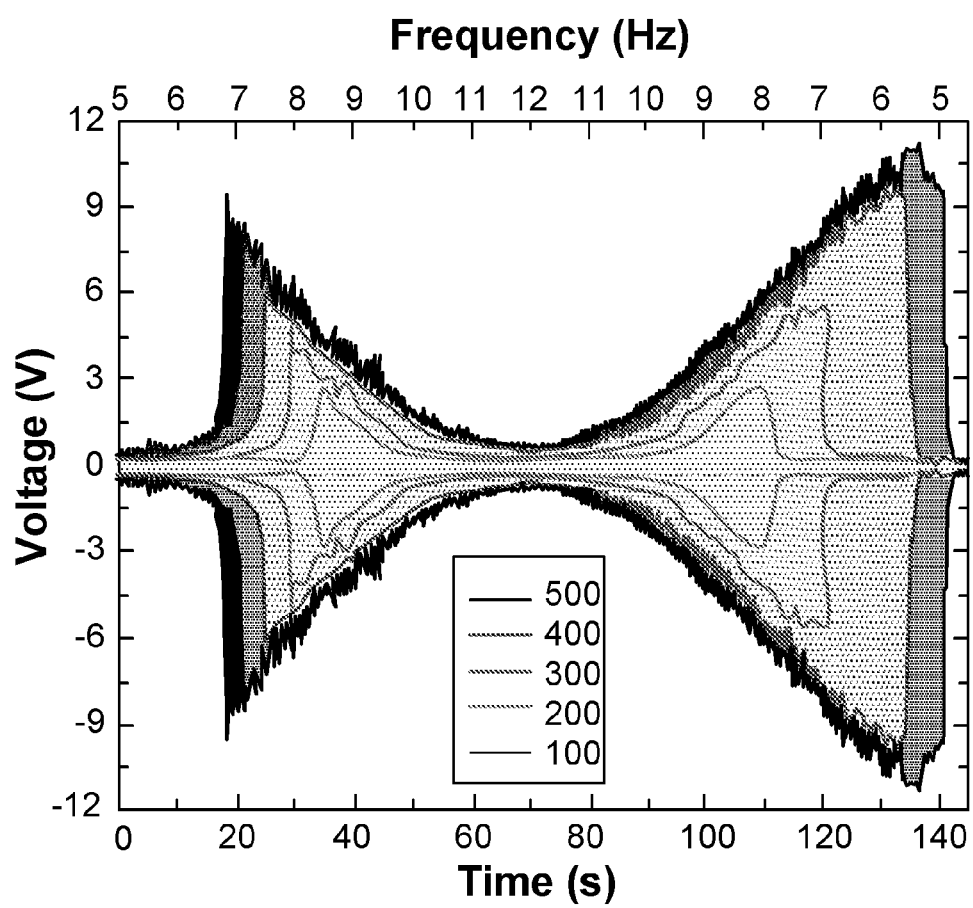
FIG. 24 is a plot of measured voltage over time across frequency sweeps for a vibration energy conversion device embodiment such as is depicted in FIGS. 21 and 22.

FIG. 24 is a plot of measured load voltage across R=680Ω as a function of frequency (legend indicates host acceleration in RMS milli-g.). Frequency sweeps between 5 to 12 Hz were performed under various host accelerations. A vibration controller (Brüel & Kjær 7541, 'controller') was programmed to sweep (at 0.1 Hz/s) up from 5 Hz to 12 Hz and then back down to 5 Hz with RMS host accelerations in the range 100-500 milli-g. A resistive load was applied and measurements of the harvester output voltage were made using an oscilloscope. The peak voltage generated across a 680Ω resistor (matched to the coil resistance) is plotted for each acceleration level in FIG. 24. A minimum root-mean-squared (RMS) acceleration of 300 milli-g was required for the sphere to reach its maximum displacement of 19 mm. For a host acceleration of 500 milli-g, the up-sweep (left hand side of FIG. 24) shows that the sphere jumps into resonant motion near 7 Hz with the voltage decreasing as the frequency is increased to 12 Hz. The 500 milli-g down-sweep (right hand side of FIG. 24) shows that the harvester voltage begins increasing near 11 Hz with the voltage continuing to increase as the frequency decreases, reaching a maximum of ~11.7 V near 5.4 Hz. As the frequency decreased below 5.4 Hz the sphere began to impact against the container walls, slightly reducing the voltage output. The 100 milli-g down-sweep (again, right hand side of FIG. 24) shows that the harvester voltage begins increasing near 9-10 Hz, similar to the 9.2 Hz resonant frequency predicted earlier.

The maximum RMS power output afforded by the cycloid motion of this design was 141 mW at 500 milli-g. For host accelerations less than 300 milli-g, there is good correlation between the measured and predicted power levels, due to the additional power produced through cycloidal motion. At 300 milli-g and above, the measured power plateaus as the peak displacement of the sphere is sufficient for the sphere to begin impacting with the harvester casing.

TABLE 1

Power density of selected harvesters as reported in the literature. (*Estimated active volume.)

| Source | Volume* (cm$^3$) | Frequency (Hz) | Maximum RMS Power (W) | Power Density (W/cm$^3$) |
|---|---|---|---|---|
| 1. Korea Inst. Sci. Tech. | 8160 | 0.9 | 3.79E+01 | 4.64E-03 |
| 2. DSTO [this work] | 59.7 | 5.4 | 1.41E-01 | 2.36E-03 |
| 3. U. Cambridge | 1800 | 3.6 | 9.56E-01 | 5.31E-04 |
| 4. U. Hawaii | 13 | 4 | 2.80E-03 | 2.15E-04 |
| 5. U. Tokyo | 500 | 6 | 9.50E-02 | 1.90E-04 |
| 6. Yamagucchi U. | 123 | 2 | 1.90E-02 | 1.54E-04 |
| 7. MIT | 23.5 | 2 | 4.00E-04 | 1.70E-05 |
| 8. U. Michigan | 2.3 | 1 | 4.00E-06 | 1.74E-06 |

The power densities of a number of vibration energy harvesters are tabulated against their respective device volumes in Table 1. These harvesters were chosen from literature as they rely on harvesting via electromagnetic induction and respond to frequencies below 10 Hz, similar to the harvester outlined in this description. It is understood that the power density of electromagnetic vibration energy harvesters decreases as device size decreases, however as shown in FIG. 6b (and Table 1) the device described in this letter has a similar power density to a device approximately 130 times larger. The mechanical advantage of cycloidal motion allows this device to produce a power density comparable to a larger scale device (operating at a similar frequency).

A harvesting device based on cycloidal motion (providing a mechanical advantage over a purely translational device) has been described and was shown to achieve an output power of 141 mW when driven at 500 milli-g and 5.4 Hz. The principle of operation of the device has been described and equations developed to predict the harvesters open circuit voltage. The power density of the harvester was found to be 2.36 mW/cm$^3$, which compares well against similar electromagnetic harvesting devices reported in the literature.

Any discussion of documents, acts, materials, devices, articles or the like which has been included in the present specification is not to be taken as an admission that any or all of these matters form part of the prior art base or were common general knowledge in the field relevant to the present disclosure as it existed before the priority date of each claim of this application.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

The embodiments and examples set forth herein are provided for illustrative purposes and are not intended to limit the operation or application of the invention. Various modifications or enhancements of the described embodiments may be made while remaining within the spirit of the invention. This description should therefore not be construed in a narrowing or limiting fashion.

The invention claimed is:

1. An energy conversion device, comprising:
   a casing;
   an electromagnetic (EM) transducer disposed at one side of the casing;
   a round magnet disposed in the casing and free to move relative to the casing and the EM transducer in at least two degrees of freedom; and
   a ferromagnetic object fixed relative to the casing at an opposite side of the casing to the EM transducer and arranged to attract the magnet toward a rest position within the casing;
   wherein the EM transducer is positioned so that movement of the magnet relative to the EM transducer varies the magnetic field through the EM transducer, thereby generating electrical potential across at least a part of the EM transducer.

2. The device of claim 1, wherein the EM transducer comprises at least one EM coil.

3. The device of claim 2, wherein the at least one EM coil comprises a plurality of EM coils.

4. The device of claim 1, wherein the magnet is free to move in a plane.

5. The device of claim 1, wherein the EM transducer and the ferromagnetic object are co-axially aligned and are positioned on opposite sides of the magnet when the magnet is in the rest position.

6. The device of claim 1, wherein the at least two degrees of freedom include at least one of: rotational freedom; and translational freedom.

7. The device of claim 1, wherein the magnet has the form of a ball bearing.

8. The device of claim 1, wherein the EM transducer is disposed at a fixed position on or in the casing.

9. The device of claim 1, wherein the casing comprises a closed container.

10. The device of claim 1, wherein, in the absence of vibration experienced by the casing, the ferromagnetic object tends to retain the magnet in the rest position.

11. The device of claim 10, wherein, in the presence of vibration experienced by the casing, the magnet tends to move about the rest position in an oscillatory or elliptical manner.

12. The device of claim 1, further comprising a movement limiting structure disposed around the magnet to limit movement of the magnet away from the rest position by more than a predetermined distance.

13. The device of claim 1, wherein the ferromagnetic object is one of a plurality of ferromagnetic objects disposed in the casing and arranged to attract the magnet toward the rest position.

14. The device of claim 1, wherein the EM transducer is disposed adjacent but spaced from the magnet when the magnet is in the rest position.

15. The device of claim 1, wherein when the magnet is at the rest position, the magnet and the EM transducer are separated by an air gap, wherein the gap is between about 0.5 mm and about 3.0 mm.

16. The device of claim 1, wherein the device comprises at least two EM transducers positioned to be affected by the magnetic field of the magnet.

17. The device of claim 16, wherein two of the at least two EM transducers are disposed on opposite sides of the magnet when the magnet is in the rest position.

18. The device of claim 1, further comprising a flat pad adjacent the ferromagnetic object across which the magnet is free to move.

19. The device of claim 18, wherein the pad comprises a rubber material, wherein the rubber material comprises one of a natural rubber and a butadiene rubber.

20. The device of claim 1, wherein the EM transducer has a thin protective shield to protect the EM transducer from contact with the magnet.

21. The device of claim 1, wherein the EM transducer comprises a plurality of segmented transducer sub-elements, each transducer sub-element configured to generate electrical potential independently of other transducer sub-elements in response to variation of the magnetic field.

22. The device of claim 1, wherein the magnet comprises a rare earth magnet having a remanent magnetic field of at least 1.0 T.

23. An energy conversion device, comprising:
    a casing;
    an electromagnetic (EM) transducer disposed at one side of the casing;
    a round magnetic object disposed in the casing and free to move relative to the casing and the EM transducer in at least two degrees of freedom; and
    a ferromagnetic object fixed relative to the casing at an opposite side of the casing to the EM transducer and arranged to attract the magnetic object toward a rest position within the casing;
    wherein the EM transducer is positioned so that movement of the magnetic object relative to the EM transducer varies the magnetic field through the EM transducer, thereby generating electrical potential across at least a part of the EM transducer.

24. A self-powering sensor system, comprising:
    a sensor;
    a power supply local to the sensor and coupled to supply power to the sensor; and
    the device of claim 1 arranged to provide electrical energy to the power supply.

* * * * *